(12) United States Patent
Ito

(10) Patent No.: US 9,602,132 B2
(45) Date of Patent: Mar. 21, 2017

(54) TRANSMITTER, ENCODING APPARATUS, RECEIVER, AND DECODING APPARATUS

(75) Inventor: Akira Ito, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 1310 days.

(21) Appl. No.: 13/404,266

(22) Filed: Feb. 24, 2012

(65) Prior Publication Data

US 2012/0159282 A1    Jun. 21, 2012

Related U.S. Application Data

(63) Continuation of application No. PCT/JP2009/064807, filed on Aug. 25, 2009.

(51) Int. Cl.
| | | |
|---|---|---|
| *H03M 13/00* | (2006.01) | |
| *H03M 13/11* | (2006.01) | |
| *H03M 13/09* | (2006.01) | |
| *H03M 13/29* | (2006.01) | |

(52) U.S. Cl.
CPC ...... *H03M 13/1111* (2013.01); *H03M 13/098* (2013.01); *H03M 13/2963* (2013.01); *H03M 13/2966* (2013.01); *H03M 13/6362* (2013.01)

(58) Field of Classification Search
CPC ... H04L 1/0057; H04L 1/0061; H04L 1/0041; H04L 1/0083; H04L 1/0072
USPC ....................................................... 714/776
See application file for complete search history.

(56) References Cited

U.S. PATENT DOCUMENTS

| | | | |
|---|---|---|---|
| 5,561,686 A | 10/1996 | Kobayashi et al. | |
| 7,028,243 B2 * | 4/2006 | Kruger ................. | H04L 1/0061 |
| | | | 375/234 |
| 2003/0009719 A1 | 1/2003 | Kanai et al. | |
| 2003/0061558 A1 | 3/2003 | Fackenthal et al. | |
| 2004/0187066 A1 * | 9/2004 | Ichihara ................. | G11B 20/18 |
| | | | 714/763 |
| 2004/0237019 A1 | 11/2004 | Lin | |
| 2005/0058089 A1 | 3/2005 | Vijayan et al. | |
| 2005/0135308 A1 | 6/2005 | Vijayan et al. | |
| 2005/0141475 A1 | 6/2005 | Vijayan et al. | |

(Continued)

FOREIGN PATENT DOCUMENTS

| | | |
|---|---|---|
| CN | 1397107 | 2/2003 |
| CN | 1574651 | 2/2005 |

(Continued)

OTHER PUBLICATIONS

Hagenauer et al., "Iterative Decoding of Binary Block and Convolutional Codes", IEEE Transactions on Information Theory, Mar. 1996, vol. 42, No. 2, pp. 429-445.

(Continued)

*Primary Examiner* — Albert Decady
*Assistant Examiner* — Enam Ahmed
(74) *Attorney, Agent, or Firm* — Myers Wolin, LLC

(57) ABSTRACT

An encoding apparatus includes a dividing unit that divides an input signal bit sequence into data blocks and an encoding unit that applies error correction encoding to the data blocks to generate code blocks decodable by repetitive decoding calculations for estimating the reliability of signal bits for a plurality of times and a generation unit that generates redundant bits by performing bit calculations between data blocks of each set combining the divided data blocks; and an output unit that outputs the generated code blocks and redundant bits.

7 Claims, 22 Drawing Sheets

(56) References Cited

U.S. PATENT DOCUMENTS

| | | |
|---|---|---|
| 2007/0113144 A1 | 5/2007 | Li |
| 2007/0124643 A1 | 5/2007 | Golitschek Edler Von Elbwart et al. |
| 2007/0147434 A1* | 6/2007 | Toyoda ............... H04J 14/0226 370/503 |
| 2008/0107192 A1 | 5/2008 | Mukkavilli et al. |
| 2008/0133998 A1 | 6/2008 | Nimbalker et al. |
| 2008/0186935 A1 | 8/2008 | Ling et al. |
| 2008/0291860 A1 | 11/2008 | Vijayan et al. |
| 2009/0175210 A1 | 7/2009 | Vijayan et al. |
| 2011/0083059 A1* | 4/2011 | Itozawa et al. ............... 714/758 |
| 2011/0197104 A1 | 8/2011 | Nimbalker et al. |

FOREIGN PATENT DOCUMENTS

| | | |
|---|---|---|
| CN | 1883120 | 12/2006 |
| JP | 64-009539 | 1/1989 |
| JP | 05-130081 | 5/1993 |
| JP | 06-274421 | 9/1994 |
| JP | 2002-171175 | 6/2002 |
| JP | 2005-295192 | 10/2005 |
| JP | 2006-528848 | 12/2006 |
| JP | 2007-525102 | 8/2007 |
| JP | 2007-288721 | 11/2007 |
| JP | 2008-141756 | 6/2008 |
| WO | 02/091592 A1 | 11/2002 |
| WO | 2005/053213 A1 | 6/2008 |

OTHER PUBLICATIONS

Notice of Reason for Rejection issued for corresponding Japanese Patent Application No. 2011-528542, mailed May 7, 2013 with English translation.

First Notification of Office Action issued for corresponding Chinese Patent Application No. 2009801102.9, issued Nov. 27, 2013, with an English translation.

Extended European search report with supplementary European search report and the European search opinion issued for corresponding European Application No. 09848708.5 dated Dec. 9, 2014.

Qi et al., "LDPC Product Codes", IEEE, pp. 481-483, IEEE, Piscataway, New Jersey (US), Sep. 6-8, 2004.

Pyndiah, "Near-Optimum Decoding of Product Codes: Block Turbo Codes", IEEE Transactions on Communications, pp. 1003-1010, vol. 46, No. 8, IEEE, Piscataway, New Jersey (US), Aug. 1998.

Qiao et al., "LDPC-SPC Product Codes", Acta Scientiarum Naturalium Universitatis Pekinensis, pp. 93-97, vol. 44, No. 01, Beijing, China, Jan. 2008, with an English abstract.

Wilson, "Linear Block Codes", Digitgal Modulation and Coding, pp. 411-425, 470-481, 489-493, Prentice Hall, Upper Saddle River, New Jersey (US), Jan. 1996.

ETSI, "Univeral Mobile Telecommunications System (UMTS); Multiplexing and channel coding (FDD) (3GPP TS 25.212 version 8.3.0 Release 8)", ETSI TS 125 212 V8.3.0, European Telecommunications Standards Institute (ETSI), Sophia Antipolis Cedex, France, Oct. 2008.

International Search Report issued for corresponding International Patent Application No. PCT/JP2009/064807, mailed Dec. 8, 2009.

International preliminary report on patentability with a written opinion issued for corresponding Japanese Patent Application No. PCT/JP2009/064807 mailed Mar. 22, 2012.

Communication pursuant to Article 94(3) EPC issued for corresponding European Application No. 09848708.5 dated Mar. 8, 2016.

* cited by examiner

US 9,602,132 B2

TRANSMITTER, ENCODING APPARATUS, RECEIVER, AND DECODING APPARATUS

CROSS-REFERENCE TO RELATED APPLICATION

This is a continuation of Application PCT/JP2009/064807, filed on Aug. 25, 2009, now pending, the contents of which are herein wholly incorporated by reference.

FIELD

The disclosure of the present specification relates to a technique of error correction.

BACKGROUND

As is known, in digital communication, a bit in a bit sequence transmitted from a transmitter may be inverted during transmission. This phenomenon is called a code error (bit error). Various factors that cause the code error cannot be completely eliminated from communication paths. Therefore, to improve the reliability of the digital communication, the transmitter and a receiver include an error correction encoder and an error correction decoder, respectively. The error correction encoder generates an error correction code for allowing detection and correction of the code error. As a result, the error correction decoder can increase the possibility of correcting the code error when there is a code error in the error-correction-encoded bit sequence. The error correction code can be used not only in digital communication between the transmitter and the receiver, but also in various digital information processing apparatuses, such as a recording apparatus and a reproduction apparatus of digital data.

An example of the error correction encoder is a turbo encoder. In turbo encoding, systematic codes including a systematic bit sequence, a first check bit sequence, and a second check bit sequence are generated. Here, the systematic bit sequence denotes an input bit sequence. The first check bit sequence is, for example, a recursive convolutional code generated by adding a bit sequence input in the past to the input bit sequence. The second check bit sequence is, for example, a recursive convolutional code generated by adding a bit sequence obtained through interleaving in the past to a bit sequence obtained by interleaving the input bit sequence. The interleaving denotes shuffling or rearranging the bit sequences in a predetermined procedure while a data rate is maintained.

An example of the error correction decoder is a turbo decoder. In turbo decoding, the reliability of the fact that a bit is "1" or "0" is increased through turbo processing for each bit in a systematic bit sequence to thereby determine a systematic bit sequence without a code error. In the turbo processing, for example, two element decoders repeat soft decision decoding while supplying extrinsic information, namely, increments of reliability to each other. A known encoding/decoding system that adopts a procedure of estimating a transmission bit sequence from a received bit sequence by repeating the soft decision decoding is, for example, a decoding system of low density parity check code. The low density parity check code is also called LDPC.

CITATION LIST

Patent Document

[Patent document 1] Japanese Patent Laid-Open No. 2008-141756
[Patent document 2] Japanese Patent Laid-Open No. 2005-295192
[Patent document 3] National Publication of International Patent Application No. 2006-528848
[Patent document 4] National Publication of International Patent Application No. 2007-525102

SUMMARY

LTE [Long Term Evolution] is an international standard of mobile communication defined by participating parties of 3GPP [Third Generation Partnership Project] with the intention of starting services around the world from around Heisei 22 (2010 in western calendar). The LTE is also called E-UTRA [Evolved Universal Terrestrial Radio Access], E-UTRAN [Evolved Universal Terrestrial Radio Access Network], or Super 3G.

In a version 8.5.0 of technical specifications ST 36.212 of the LTE, code block division is defined as an example of an error correction encoding process. In the code block division, transmission data is divided into a plurality of code blocks in the same size. For example, a CRC [Cyclic Redundancy Check] code used for detecting a code error is added to each code block, and then turbo encoding is performed. A receiver identifies the CRC codes added to the turbo-decoded code blocks. If a code error is detected in any one of the code blocks, the receiver requests the transmission side to retransmit all code blocks, that is, to retransmit the transmission data.

In general, the decoding process of the error correction code is performed by selecting the most likely bit sequence in the entire code block. Theoretically, the longer the code length, the better the characteristics.

However, if the transmission data is not divided into code blocks, the circuit size of the error correction decoder needs to be significantly increased. Furthermore, a complicated process of error correction decoding in the receiver may not be finished within TTI [Transmission Time Interval]. The TTI denotes a minimum transmission time interval allocated to a mobile terminal. Therefore, there is a limit to the code length of a realistic code. Thus, in standardization specifications such as the LTE, the transmission data is divided into code blocks of sizes sufficiently close to the limit of the code length.

However, if the transmission data is divided into code blocks, the error correction rate decreases compared to when the transmission data is not divided, and the characteristics are deteriorated. This is because the division into the code blocks limits the range of information contributed to the error correction, and the error correction performance is degraded.

An encoding apparatus as an aspect of an embodiment includes: a dividing unit that divides an input signal bit sequence into data blocks; an encoding unit that applies error correction encoding to the data blocks to generate code blocks decodable by repetitive decoding calculations for estimating the reliability of signal bits for a plurality of times; a generation unit that generates redundant bits by performing bit calculations between data blocks of each set combining the divided data blocks; and an output unit that outputs the generated code blocks and redundant bits.

A decoding apparatus as an aspect of the embodiment includes the following plurality of elements. The present decoding apparatus includes an input unit that inputs redundant bits generated between data blocks included in each set combining a plurality of data blocks obtained by dividing a signal bit sequence and the code blocks obtained by applying error correction encoding to the data blocks. The present decoding apparatus also includes an in-block repetitive calculation unit that repeats a process, by using a bit sequence in the code blocks as an input, to calculate reliability information of signal bits in the data blocks that are error-correction-encoded to the code blocks and further, by using the calculated reliability information as an input, to calculate new reliability information of the signal bits in the data blocks that are error-correction-encoded to the code blocks. The present decoding apparatus also includes an inter-block repetitive calculation unit that repeats a process to calculate inter-block reliability information indicating the reliability of signal bits contributing to the generation of the redundant bits between the data blocks included in each set, based on the redundant bits generated between the data blocks included in each set and the reliability information of the signal bits in the data blocks, the reliability information repeatedly calculated by the in-block repetitive calculation unit, and to input the inter-block reliability information as reliability information of the signal bits to the in-block repetitive calculation unit.

The object and advantage of the embodiment will be realized and attained by means of the elements and combinations particularly pointed out in the appended claims. It is to be understood that both the foregoing general description and the following detailed description are exemplary and explanatory only and are not restrictive of the invention, as claimed.

DESCRIPTION OF EMBODIMENT(S)

An aspect of an embodiment is made in view of the problems included in the conventional techniques, and an object thereof is to improve reliability of digital communication in which a code block dividing process is executed.

Hereinafter, a wireless communication system as the present embodiments will be described with reference to the attached drawings.

The wireless communication system described below is just embodiments. A transmitter as an aspect of the present invention, a receiver as another aspect, and other aspects are not limited by specific technical matters described below.

First Embodiment

<<Configuration>>

Figure 1:
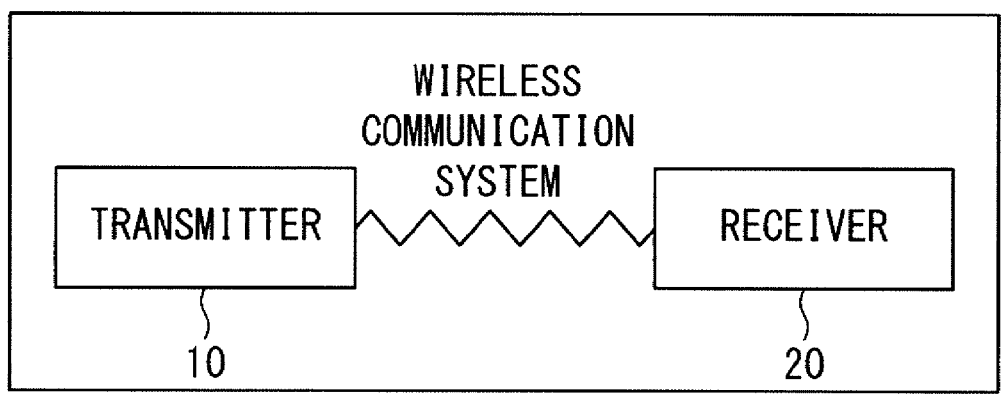
FIG. 1 is a diagram showing a configuration of a wireless communication system as the present embodiment.

FIG. 1 is a diagram showing a configuration of a wireless communication system as the present embodiment.

The wireless communication system includes a transmitter 10 and a receiver 20. The transmitter 10 generates a high-frequency electrical signal and converts the electrical signal to an electric wave to emit the electric wave. The receiver 20 converts a sensed electric wave to an electrical signal to acquire the electrical signal. A repeater may relay the electric wave between the transmitter 10 and the receiver 20. Examples of the repeater include a cell phone repeater (line compensator), an electric wave repeater (repeater) for PHS [Personal Handyphone System], a wireless LAN [Local Area Network] router, and a wireless hub.

<Transmitter>

Figure 2:
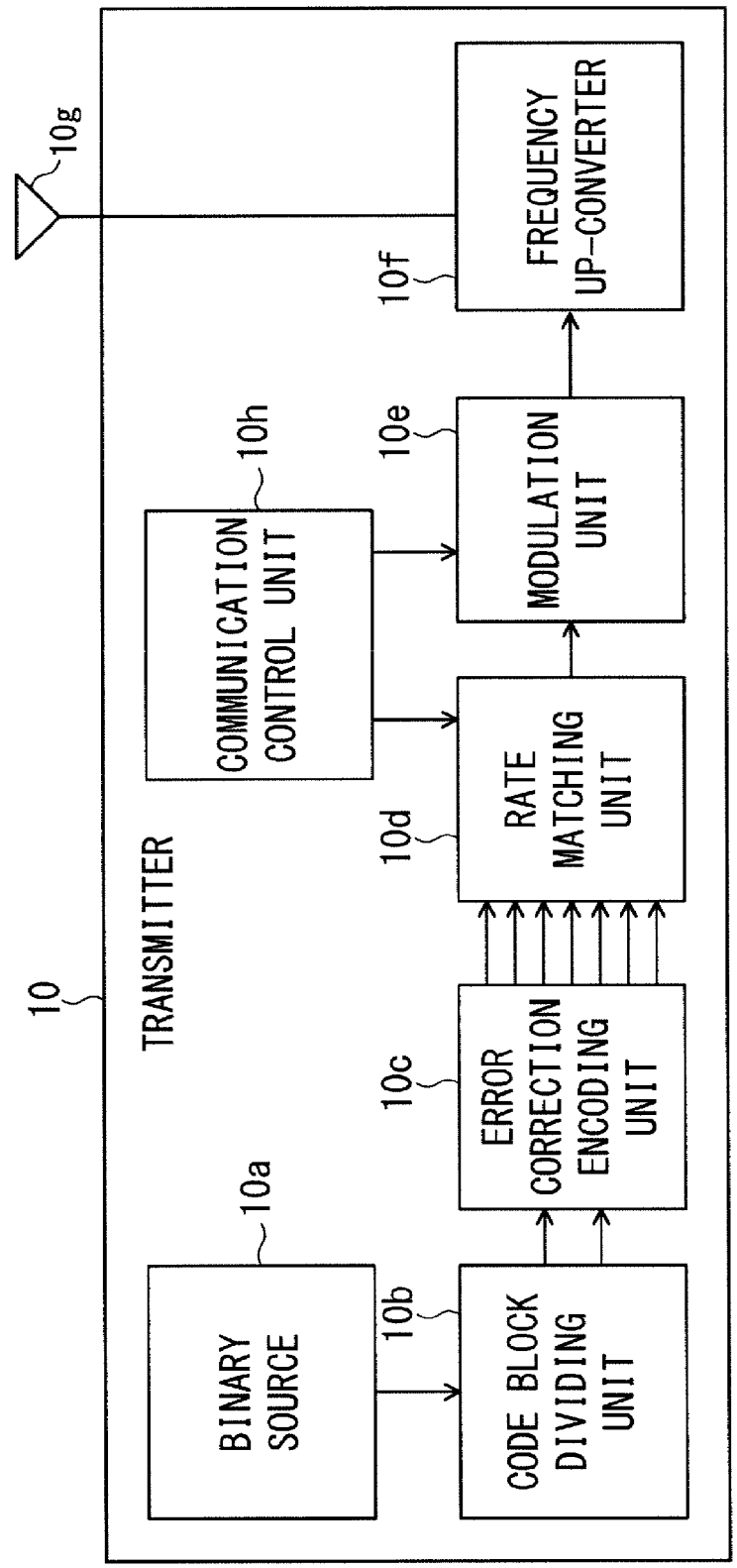
FIG. 2 is a diagram showing a configuration of a transmitter.

FIG. 2 is a diagram showing a configuration of the transmitter 10.

The transmitter 10 includes a binary source 10a, a code block dividing unit 10b, an error correction encoding unit 10c, a rate matching unit 10d, a modulation unit 10e, a frequency up-converter 10f, an antenna 10g, and a communication control unit 10h.

The binary source 10a outputs digital information, which is a result of various processes, as a bit sequence. An example of the binary source 10a includes a computer including a CPU [Central Processing Unit], a storage unit, and a recording unit. Examples of the storage unit include a DRAM [Dynamic Random Access Memory] and an SRAM [Static Random Access Memory]. Examples of the recording unit include an SSD [Solid State Drive] apparatus, an HDD [Hard Disk Drive] apparatus, a BD [Blu-ray Disk] drive apparatus, a DVD [Digital Versatile Disk] drive apparatus, a +R/+RW drive apparatus, a CD [Compact Disk] drive apparatus, a memory card drive apparatus, and a flexible disk drive apparatus. Examples of the computer include a personal computer, a cell phone, and a PDA [Personal Digital Assistant]. Examples of the personal computer include a desktop PC [Personal Computer], a notebook PC, a laptop PC, a pen computer, a netbook, and a wearable computer.

The code block dividing unit 10b divides a bit sequence input from the binary source 10a into code blocks with N bits. For example, in the LTE, the maximum value of the number of bits N is 6144 bits. In the present embodiment, although the bit sequence is divided into two code blocks, the bit sequence may be divided into three or more code blocks. The code block dividing unit 10b divides the input bit sequence into a plurality of code blocks with the same number of bits. If the input bit sequence is not dividable by the division number, the code block dividing unit 10b supplements some bits to the input bit sequence to allow the division. The supplement process is described in, for example, Japanese Patent Laid-Open No. 2001-308720. The code block dividing unit 10b is an example of the dividing unit.

In the embodiments following the first embodiment, data obtained by dividing a bit sequence not subjected to error correction encoding may be called data blocks. The data block is a name for explicitly showing that the code block is in a state before error correction encoding. Therefore, when a block is called a code block, the code block includes both the data block and the code block as data obtained by applying error correction encoding to the data block.

The error correction encoding unit 10c performs error correction encoding to, for example, each set of two code blocks output from the code block dividing unit 10b. The error correction encoding unit 10c is an example of the encoding unit. A specific configuration of the error correction encoding unit 10c will be described later.

The rate matching unit 10d selects bits to be actually transmitted from the bit sequence output from the error correction encoding unit 10c. Obviously, the bits that are not selected will not be transmitted. The positions of the bits to be selected, that is, the positions of the bits to be thinned out are changed according to an encoding rate (coding rate) provided from the communication control unit 10h. Here, the encoding rate can be defined by, for example, encoding rate=m/M, where M is the number of bits of the code word when information of m bits is encoded.

In the present wireless communication system, which bits will be selected according to the values of the encoding rate are determined in advance. Therefore, the receiver 20 can figure out where the thinned out bits exist just by receiving the encoding rate from the transmitter 10. A specific example of the selecting method of the bits to be selected will be described later.

The modulation unit 10e performs modulation of putting the bit sequence output from the rate matching unit 10d on a carrier signal as a baseband signal. The modulation method is changed according to the instruction from the communication control unit 10h. Examples of the modulation method include QPSK [Quadrature Phase Shift Keying], 16-QAM [Quadrature Amplitude Modulation], and 64-QAM.

The frequency up-converter 10f up-converts the frequency of the modulated carrier signal output from the modulation unit 10e to a radio frequency. The up-converted carrier signal is converted to an electric wave by the antenna 10g and emitted.

The communication control unit 10h determines the encoding rate and the modulation method according to the condition of a communication path, the amount of transmission data, the priority of data, and the like. The communication control unit 10h is configured to transmit the encoding rate and information indicating the modulation method to the receiver 20 through a channel for control. Since the number of physical bits changes depending on the physical resources, the communication control unit 10h also transmits information for establishing the number of physical bits to the receiver 20 through the channel for control. Here, the number of physical bits is indicated by, for example, the number of bits that the transmitter 10 can transmit per TTI [Transmission Time Interval] from the antenna 10g. For example, the physical resources denote the number of subcarriers in LTE (OFDM [Orthogonal Frequency Division Multiplexing]) and denote the number of codes in HSDPA [High Speed Downlink Packet Access] (CDMA [Code Division Multiple Access]). The rate matching unit 10d is an example of the output unit. However, the configuration of the transmitter from the rate matching unit 10d to the antenna 10g can also be considered as an example of the output unit.

Figure 3:
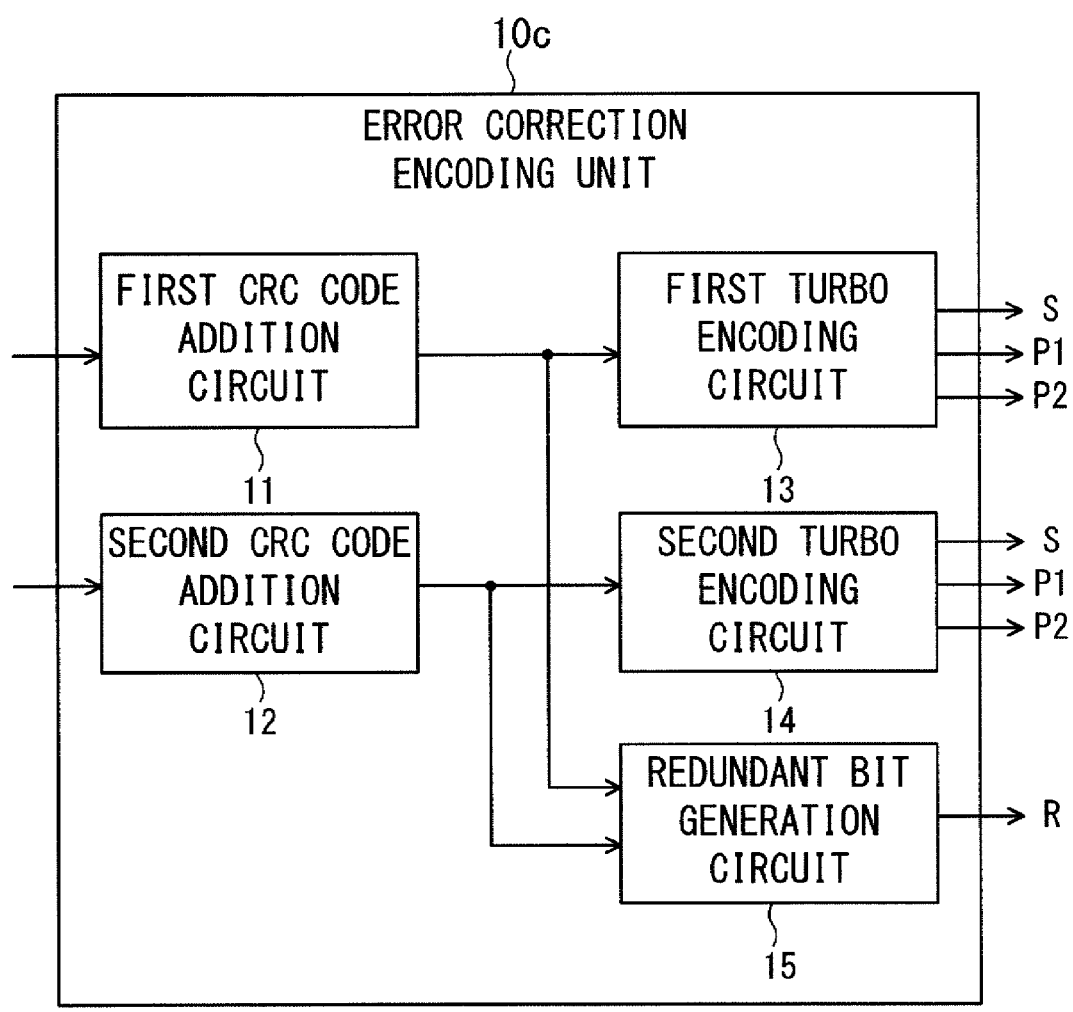
FIG. 3 is a diagram showing a configuration of an error correction encoding unit.

FIG. 3 is a diagram showing a configuration of the error correction encoding unit 10c.

The error correction encoding unit 10c includes a first CRC [Cyclic Redundancy Check] code addition circuit 11, a second CRC code addition circuit 12, a first turbo encoding circuit 13, a second turbo encoding circuit 14, and a redundant bit generation circuit 15. In the present embodiment, the code block dividing unit 10b outputs two code blocks in parallel. For parallel processing of the two code blocks output in parallel, the error correction encoding unit 10c includes two CRC code addition circuits and two turbo encoding circuits. However, when three or more code blocks are output in parallel from the code block dividing unit 10b, the error correction encoding unit 10c may include the same number of CRC code addition circuits and turbo encoding circuits as the number of code blocks output in parallel.

The first and second CRC code addition circuits 11 and 12 add a CRC code to the input code blocks. Here, when a bit sequence of n bits is expressed by a polynomial of degree (n−1), the CRC code added to the code blocks is created based on a remainder formula obtained by dividing a polynomial based on the polynomial of degree (n−1) by a predetermined generator polynomial. The generator polynomial is determined in advance so that the same generator polynomial is used in the transmitter 10 and the receiver 20. The receiver 20 creates the polynomial based on the received code blocks. The polynomial obtained from the received word is divided by the predetermined generator polynomial. If the remainder of the division matches the CRC code, the receiver 20 determines that there is no code error in the received code block. On the other hand, if the remainder of the division does not match the CRC code, the receiver 20 determines that there is a code error in the received code block. In this way, the CRC code is used to detect the code error in the code blocks.

The first and second turbo encoding circuits 13 and 14 perform turbo encoding of the code blocks with the CRC code added by the first and second CRC code addition circuits 11 and 12. In the turbo encoding, for example, a systematic bit sequence, a first check bit sequence, and a second check bit sequence are created. Here, the systematic bit sequence is the bit sequence in the input code block. The first check bit sequence is, for example, created by a recursive convolutional code generated by adding a code block input in the past to the input code block. The second check bit sequence is created by a recursive convolutional code generated by adding a bit sequence obtained through interleaving in the past to a bit sequence obtained by interleaving the input code block. In the interleaving, the bit sequences in the code block are shuffled in a predetermined procedure while the data rate is maintained. In reverse interleaving, the bit sequences in the code block are shuffled in a procedure opposite the predetermined procedure.

Figure 4:
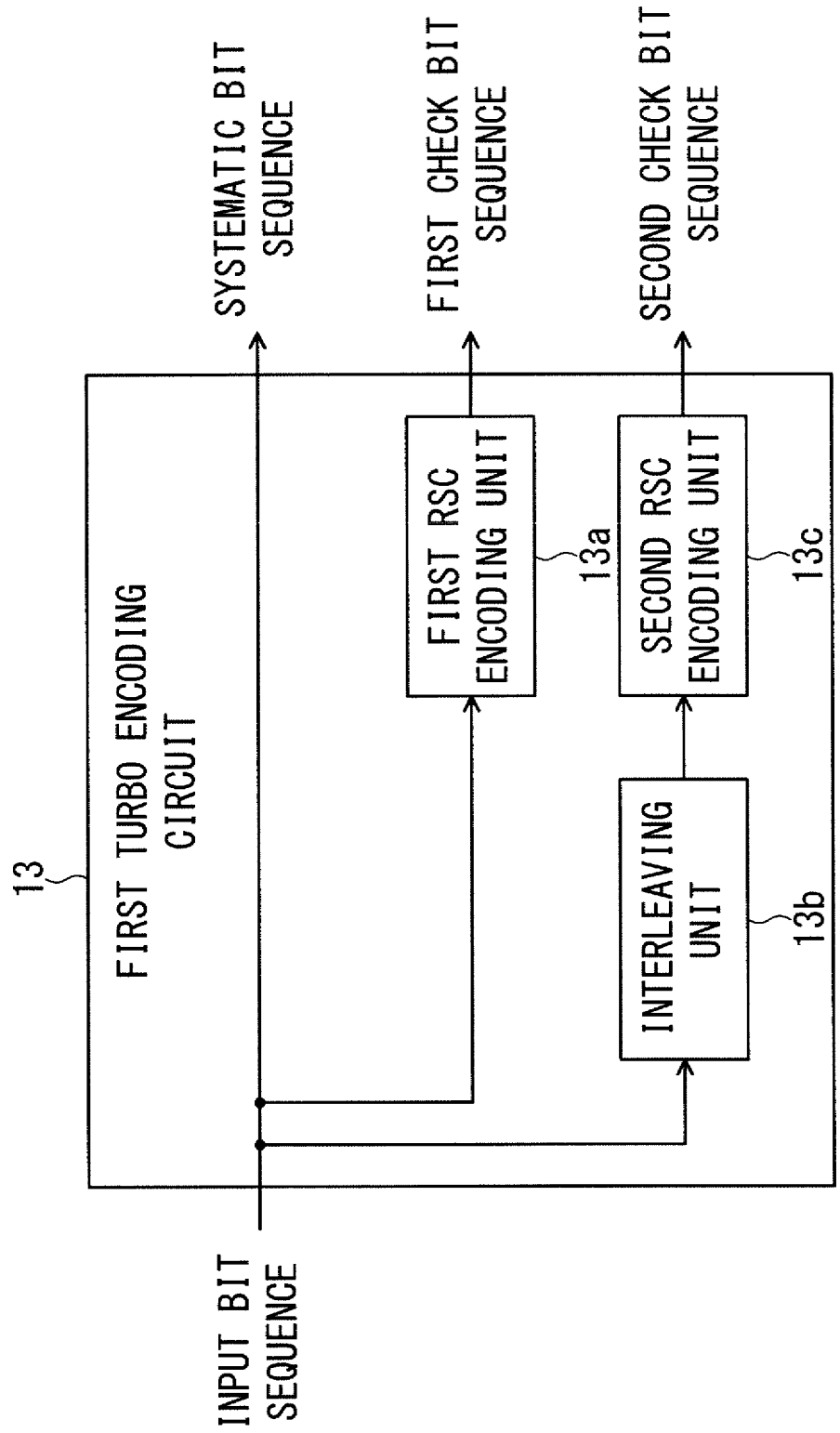
FIG. 4 is a diagram showing a configuration of a first turbo encoding circuit.

FIG. 4 is a diagram showing a configuration of the first turbo encoding circuit 13.

Figure 5:
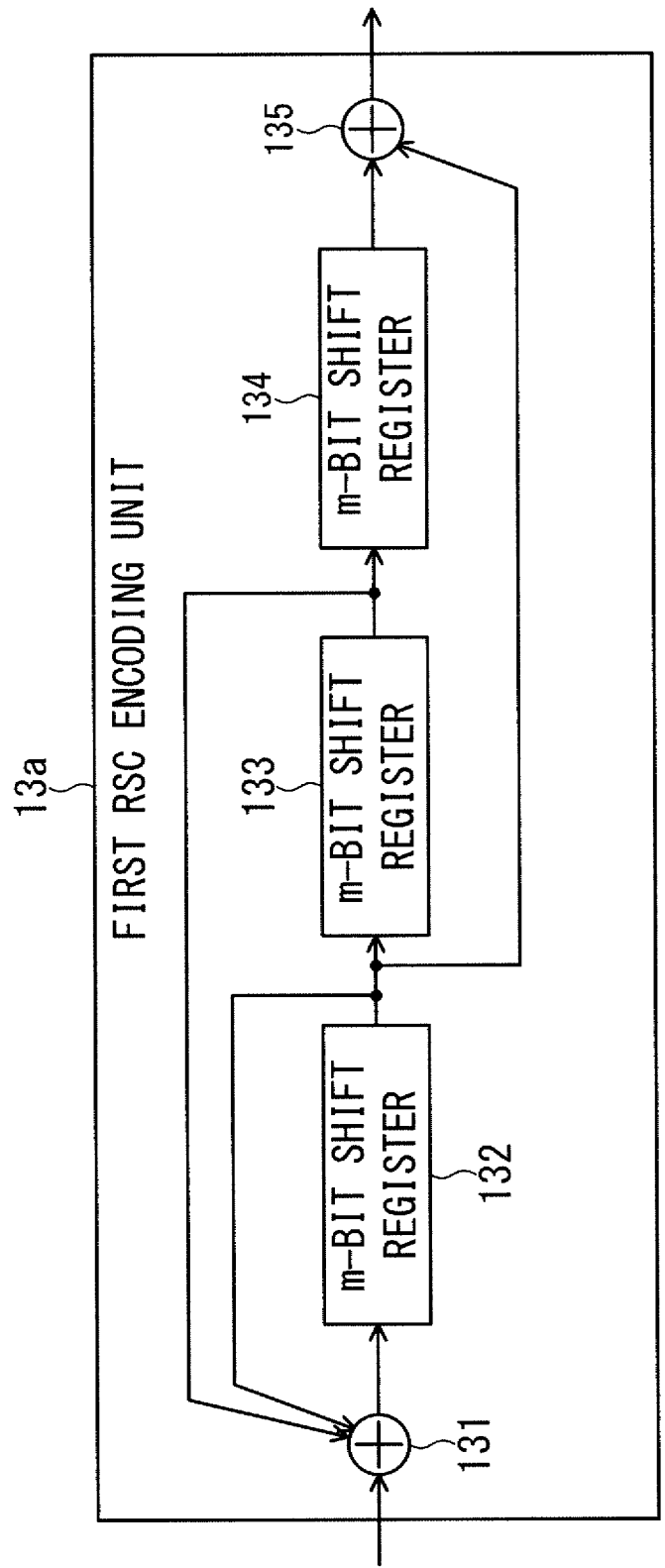
FIG. 5 is a diagram showing a configuration of an RSC encoding unit.

The first turbo encoding circuit 13 outputs the input code block as the systematic bit sequence. The first turbo encoding circuit 13 includes a first RSC [Recursive Systematic Convolutional] encoding unit 13a, an interleaving unit 13b, and a second RSC encoding unit 13c. The first RSC encoding unit 13a recursively adds a bit sequence input in the past to the input bit sequence and outputs the added bit sequence as the first check bit sequence. Specifically, for example, the first RSC encoding unit 13a includes some m-bit shift registers and some modulo-2 m-bit adders. In the first RSC encoding unit 13a illustrated in FIG. 5, a modulo-2 first m-bit adder 131, three m-bit shift registers 132 to 134, and a modulo-2 second m-bit adder 135 are connected in series in order from the input side. When a bit sequence is input, the first m-bit adder 131 adds output bit sequences of the first and second m-bit shift registers 132 and 133 to the input bit sequence and outputs the bit sequence to the first m-bit shift register 132. When a bit sequence is input from the first m-bit adder 131, the first m-bit shift register 132 outputs a bit sequence held inside to the first and second m-bit adders 131 and 135 and the second m-bit shift register 133. When a bit sequence is input from the first m-bit shift register 132, the second m-bit shift register 133 outputs a bit sequence held inside to the first m-bit adder 131 and the third m-bit shift register 134. When a bit sequence is input from the second m-bit shift register 133, the third m-bit shift register 134 outputs a bit sequence held inside to the second m-bit adder 135. The second m-bit adder 135 adds the bit sequences output from the first and third m-bit shift registers 132 and 134 and outputs the result. In this way, the first RSC encoding unit 13a illustrated in FIG. 5 recursively adds the bit sequence input in the past to the input bit sequence and outputs the input bit sequence as the first check bit sequence. In the present embodiment, the second RSC encoding unit 13c shown in FIG. 4 also has a configuration illustrated in FIG. 5 like the first RSC encoding unit 13a. However, the bit sequence interleaved by the interleaving unit 13b is input to the second RSC encoding unit 13c. Therefore, the second RSC encoding unit 13c recursively adds a bit sequence interleaved in the past to the interleaved bit sequence and outputs the bit sequence. Therefore, the second RSC encoding unit 13c outputs the second check bit sequence.

In the present embodiment, the second turbo encoding circuit 14 shown in FIG. 3 also has the same configuration as the configuration shown in FIG. 4. Therefore, the second turbo encoding circuit 14 outputs the input code block as the systematic bit sequence. The first RSC encoding unit outputs the first check bit sequence, and the second RSC encoding unit outputs the second check bit sequence.

Figure 6:
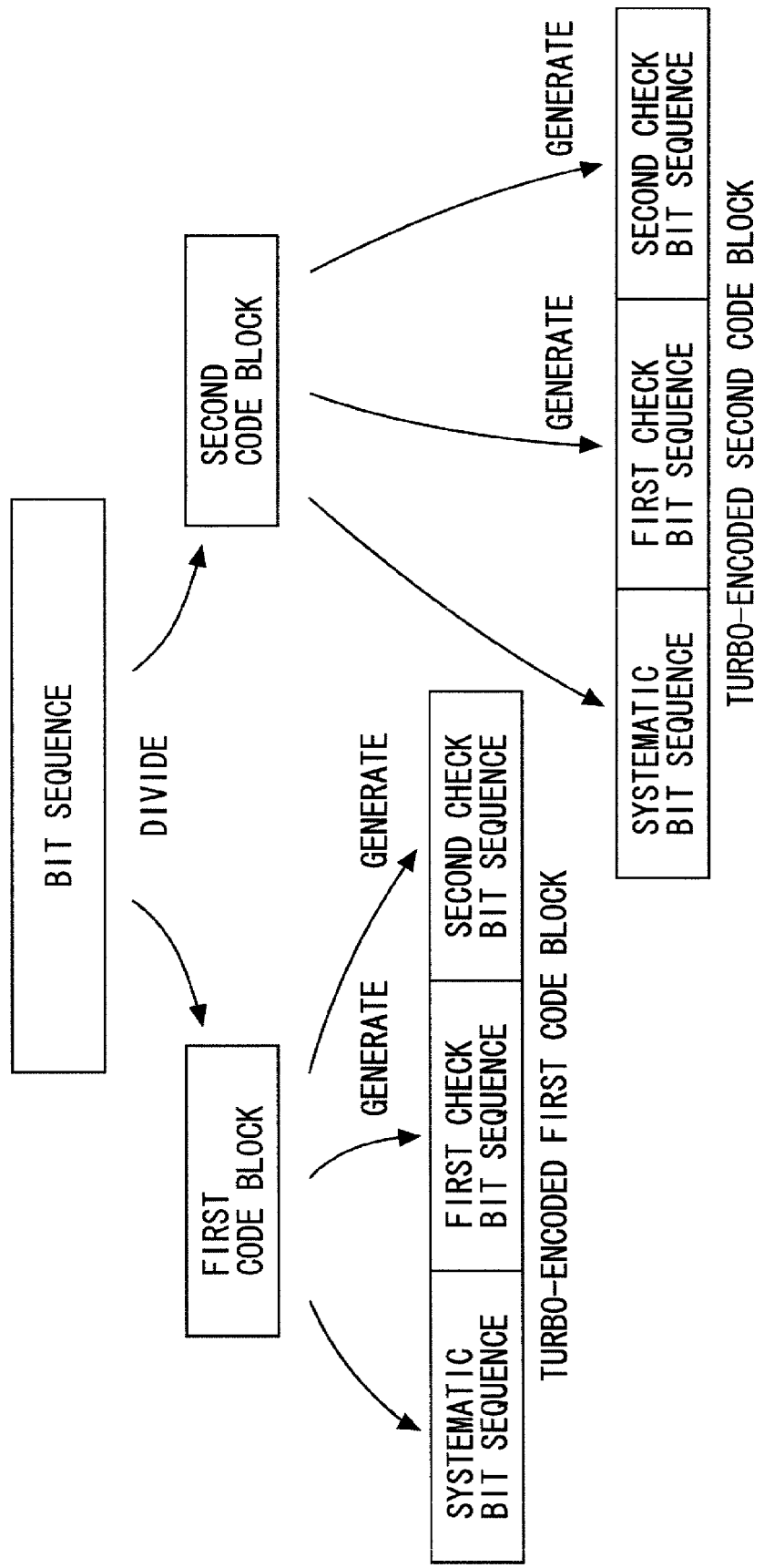
FIG. 6 is a diagram schematically showing division and turbo encoding of a bit sequence.

FIG. 6 is a diagram schematically showing division and turbo encoding of a bit sequence.

FIG. 6 shows two code blocks to be turbo-encoded in parallel. As shown in FIG. 6, in the present embodiment, the bit sequence output from the binary source 10a is divided into first and second code blocks with a predetermined number of bits. As described, the code blocks before turbo encoding are also called data blocks to explicitly show that the blocks are not encoded yet. As described, the code block dividing unit 10b performs the division. If the number of bits including the information bits and the CRC codes is smaller than that of two code blocks, a fixed value, for example, bit 0, is assigned to the free space of the second code block, and then the CRC code is added. The first CRC code addition circuit 11 shown in FIG. 3 adds the CRC code to the first code block, and then the first turbo encoding circuit 13 applies turbo encoding to the first code block to convert the first code block to systematic codes. The systematic codes include the systematic bit sequence, the first check bit sequence, and the second check bit sequence. The second CRC code addition circuit 12 shown in FIG. 3 adds the CRC code to the second code block, and then the second turbo encoding circuit 14 applies turbo encoding to the second code block to convert the second code block to systematic codes. The systematic codes also include the systematic bit sequence, the first check bit sequence, and the second check bit sequence. The first and second code blocks are turbo-encoded and converted to the systematic codes and then output to the rate matching unit 10d as shown in FIG. 2.

Figure 7:
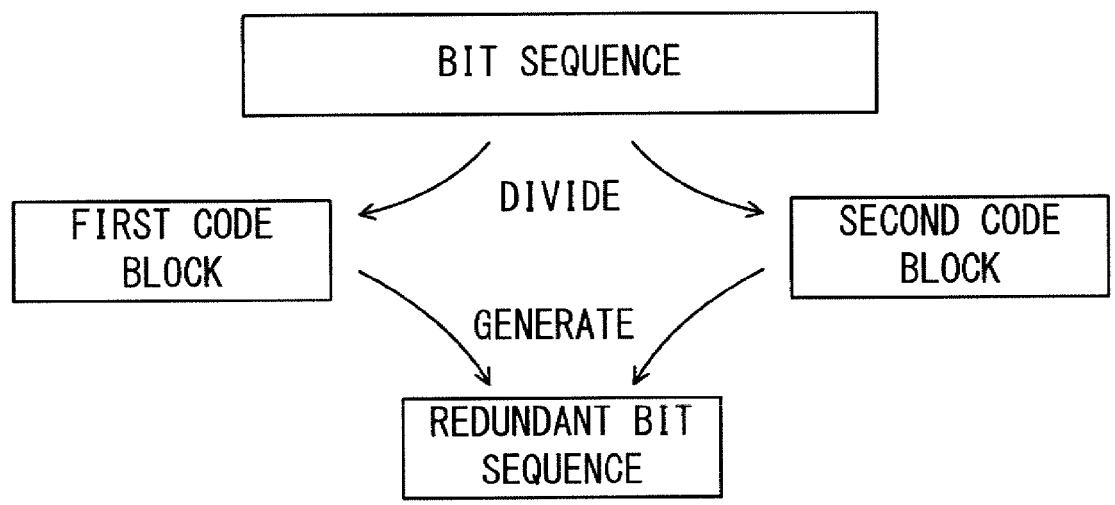
FIG. 7 is a diagram schematically showing generation of a redundant bit sequence.
Figure 8:
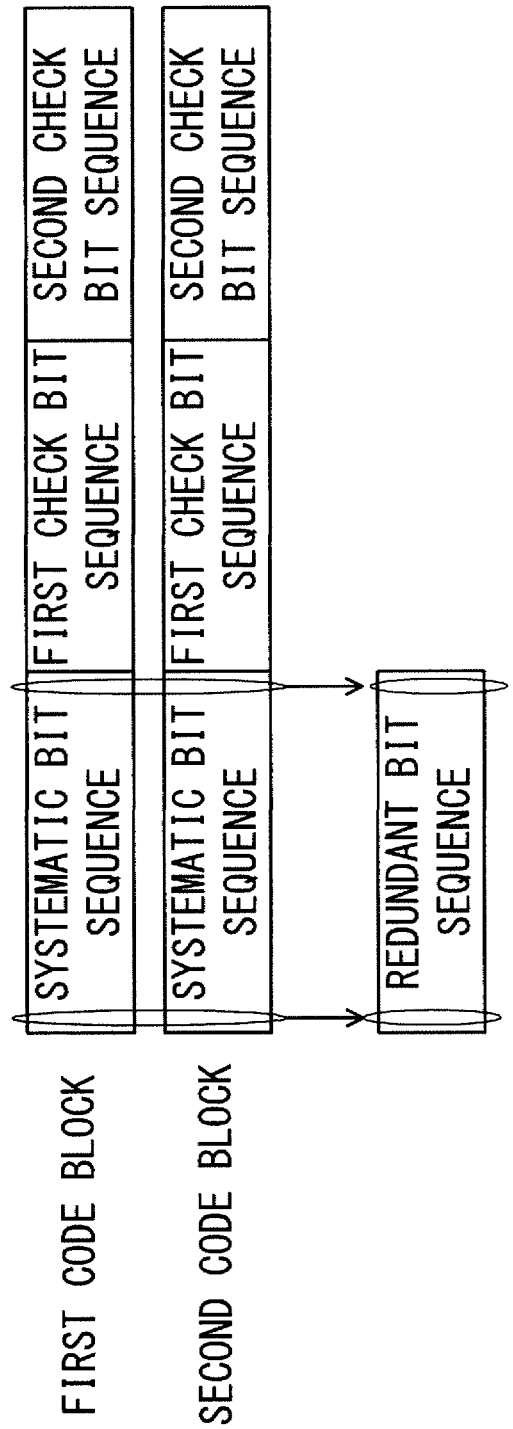
FIG. 8 is a diagram showing a relationship between turbo-encoded code blocks and the redundant bit sequence.

As shown in a schematic diagram of FIG. 7, the redundant bit generation circuit 15 shown in FIG. 3 generates a redundant bit sequence from the first and second code blocks. The redundant bit generation circuit 15 is an example of the generation unit. The redundant bit sequence is information that can also be called a parity bit between data blocks. For example, the redundant bit generation circuit 15 calculates exclusive OR between bits at each position from the top to the bottom of the first and second code blocks to generate redundant bits. Therefore, the redundant bit generation circuit 15 outputs a redundant bit sequence with the same number of bits as the first and second code blocks. Each redundant bit is in a relationship as shown in FIG. 8 with respect to the turbo-encoded first and second code blocks. More specifically, the first and second code blocks are correlated through the redundant bit sequence. In the present embodiment, since two code blocks are output from the code block dividing unit 10b, the redundant bit generation circuit 15 calculates exclusive OR between bits of the same position in an order from the top in the first and second code blocks. However, when the code block dividing unit 10b outputs three or more code blocks, the redundant bit generation circuit 15 may calculate exclusive OR of the bits of the same position in the order from the top in the three or more code blocks. In any case, the redundant bit sequence is output to the rate matching unit 10d as shown in FIG. 2. In the present embodiment, although the redundant bits are generated by extracting the bits one by one from each code block and calculating the exclusive OR, the aspects of the present invention are not limited to this. For example, the redundant bits may be generated by extracting predetermined two or more bits each time from each code block and calculating the exclusive OR.

The exclusive OR may be calculated between the first code block and the second code block after predetermined bit cyclical shift of the second code block.

The creation procedure of the redundant bits is not limited to the exclusive OR between the bits of the same position in the order from the top. For example, any encoding method known as a block code may be adopted. For example, CRC encoding may be performed to the bit sequence including the bits selected from the code blocks. Furthermore, hash values may be obtained by a predetermined procedure for the bit sequence including the bits selected from the code blocks. Therefore, the redundant bits can be generated from various bit calculations for the first code block and the second code block.

As described, the rate matching unit 10d selects bits to be actually transmitted from the bit sequence output from the error correction encoding unit 10c. An example of the method of selecting the bits includes a method of using a thin-out parameter e when (N−M) bits are selected from N bits, that is, when M bits are thinned out. An initial value of the thin-out parameter e is set to N, and a value of "a" times M is repeatedly subtracted from the thin-out parameter e. When the thin-out parameter e is zero or lower as a result of an n-th subtraction, an n-th bit is determined as a thin-out target. Subsequently, a value of "a" times N is added to the thin-out parameter e to restart the process of repeatedly subtracting the value of "a" times M. As a result of repeating the determination of the thin-out target for M times, thin-out targets of M bits are determined, that is, (N−M) bits are selected. For example, when three bits are thinned out from ten bits, if "a" is 1, N is 10 and M is 3. Therefore, when the value of "a" times M is repeatedly subtracted from the initial value 10, the thin-out parameter e becomes −2 at the fourth time. Subsequently, when 10 as the value of "a" times N is added to the thin-out parameter e to restart the subtraction, the thin-out parameter becomes −1 at the seventh time. Subsequently, when 10 as the value of "a" times N is added to the thin-out parameter e to restart the subtraction, the thin-out parameter becomes 0 at the tenth time. In the example, the fourth, seventh, and tenth bits of ten bits are thinned out. The rate matching unit 10d may be configured to change the value of "a" in the systematic bit sequence, the first check bit sequence, and the second check bit sequence. In the present embodiment, since the numbers of bits of the systematic bit sequence, the first check bit sequence, and the second check bit sequence are the same, bits at different positions are thinned out by changing the value of "a". The value of "a" for the first check bit sequence and the value of "a" for the second check bit sequence are determined in advance in the transmitter 10 and the receiver 20.

As shown in FIG. 3, the error correction encoding unit 10c of the present embodiment includes the redundant bit generation circuit 15. Therefore, compared to a conventional error correction encoding unit, more bit sequences are output as transmission targets. However, as described, since the number of physical bits is determined, the number of bits output by the error correction encoding unit 10c to the rate matching unit 10d may exceed the number of physical bits. In this case, the rate matching unit 10d is configured to thin out more first and second check bit sequences compared to when there is no redundant bit sequence. Therefore, the number of output bits does not exceed the number of physical bits. Although the rate matching unit 10d can also thin out the systematic bit sequence, missing of bits in the systematic bit sequence significantly affects the reliability of digital communication compared to missing of bits in the first and second check bit sequences. Therefore, in the present embodiment, the first and second check bit sequences are thinned out.

Figure 9:
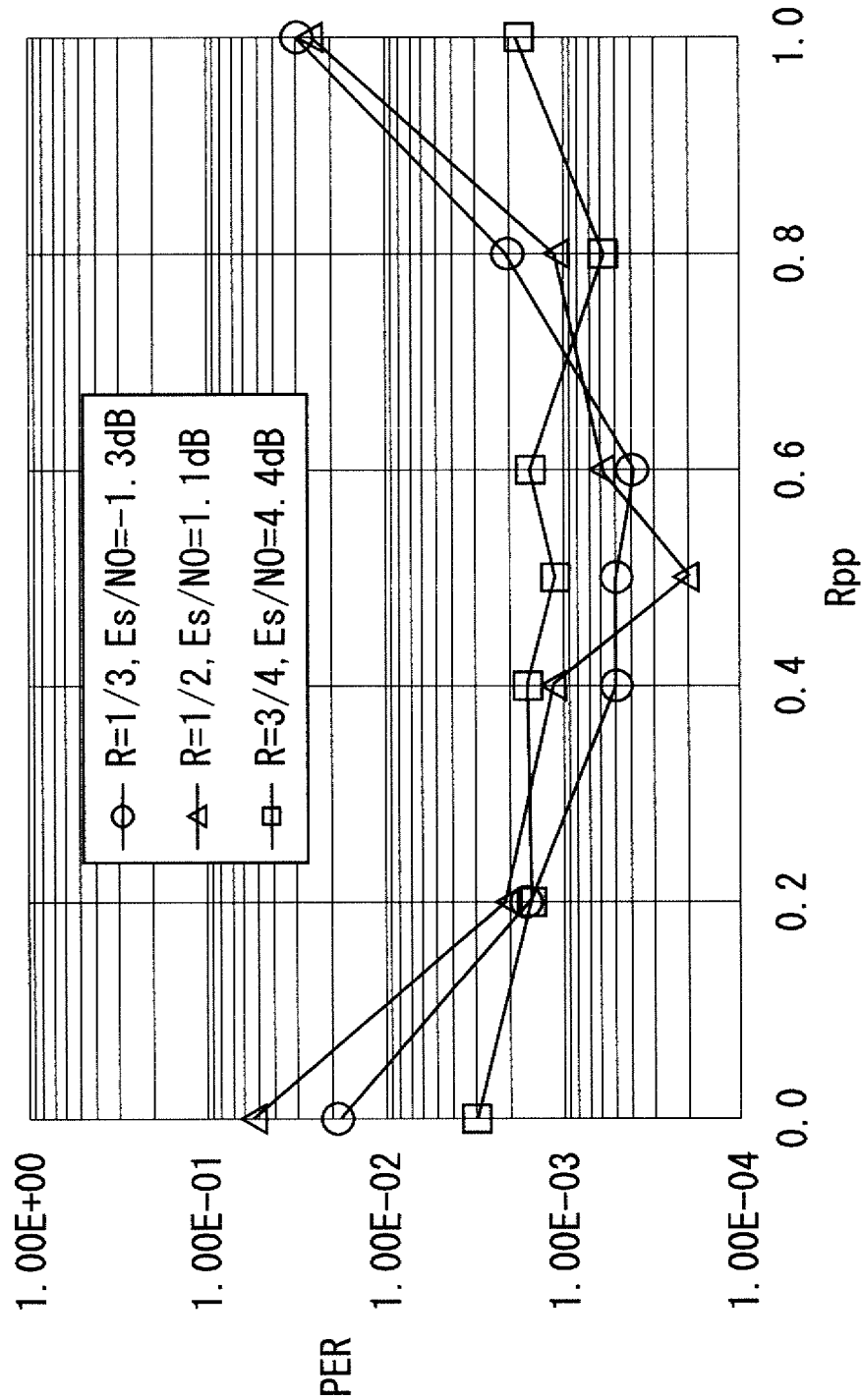
FIG. 9 is a diagram showing a graph of a relationship between an insertion rate of redundant bit sequence to systematic code and a packet error rate.

FIG. 9 is a diagram showing a graph of a relationship between an insertion rate of redundant bit sequence to systematic code and a packet error rate.

The graph shown in FIG. 9 is a simulation result. In FIG. 9, the vertical axis denotes the packet error rate (PER), and the horizontal axis denotes the insertion rate of redundant bit sequence to systematic code. Here, the insertion rate denotes a rate of the number of bits of the redundant bit sequence incorporated into the systematic code. For example, when the number of bits of the systematic bit sequence, the first check bit sequence, the second check bit sequence, and the redundant bit sequence is 5000 bits each, an example in which the insertion rate is 0.3 includes when 1500 bits of the redundant bit sequence are selected, 1500 bits of the systematic code are thinned out, and 13500 bits are selected. At this time, 1500 bits of the redundant bit sequence are inserted to 5000 bits of the systematic bit sequence, and the insertion rate=1500/5000=0.3. FIG. 9 shows graphs when the encoding rate (coding rate) is ⅓, ½, and ¾, respectively.

As shown in FIG. 9, if the encoding rate is ⅓, the packet error rate is the lowest when the insertion rate of redundant bit sequence is 0.6. If the encoding rate is ½, the packet error rate is the lowest when the insertion rate of redundant bit sequence is 0.5. If the encoding rate is ¾, the packet error rate is the lowest when the insertion rate of redundant bit sequence is 0.8. Therefore, to reduce the packet error rate, it is desirable that the insertion rate of redundant bit sequence can be changed according to the encoding rate. The rate matching unit 10d of the present embodiment changes the insertion rate of redundant bit sequence according to the encoding rate. The correspondence between the insertion rate of redundant bit sequence and the encoding rate may be determined in advance in the transmitter 10 and the receiver 20. In this case, the receiver 20 can figure out the insertion rate of redundant bit sequence just by receiving the encoding rate from the transmitter 10. The communication control unit 10h may notify the receiver 20 of the insertion rate of redundant bit sequence through the channel for control.

In the present embodiment, the bit sequence is divided into a set of two code blocks to be processed in parallel, for example, the first and second code blocks. Meanwhile, a mode in which the bit sequence is divided into three or more code blocks and processed in parallel will be considered. For example, when redundant bits are created among N code blocks belonging to each set of N code blocks, the number of bits thinned out for the insertion of the redundant bit sequence is smaller than that in the present embodiment when one systematic code is observed. Therefore, the insertion rate of redundant bit sequence can be increased with an increase in the number of code blocks included in the sets of code blocks for which the redundant bits are created.

<Receiver>

Figure 10:
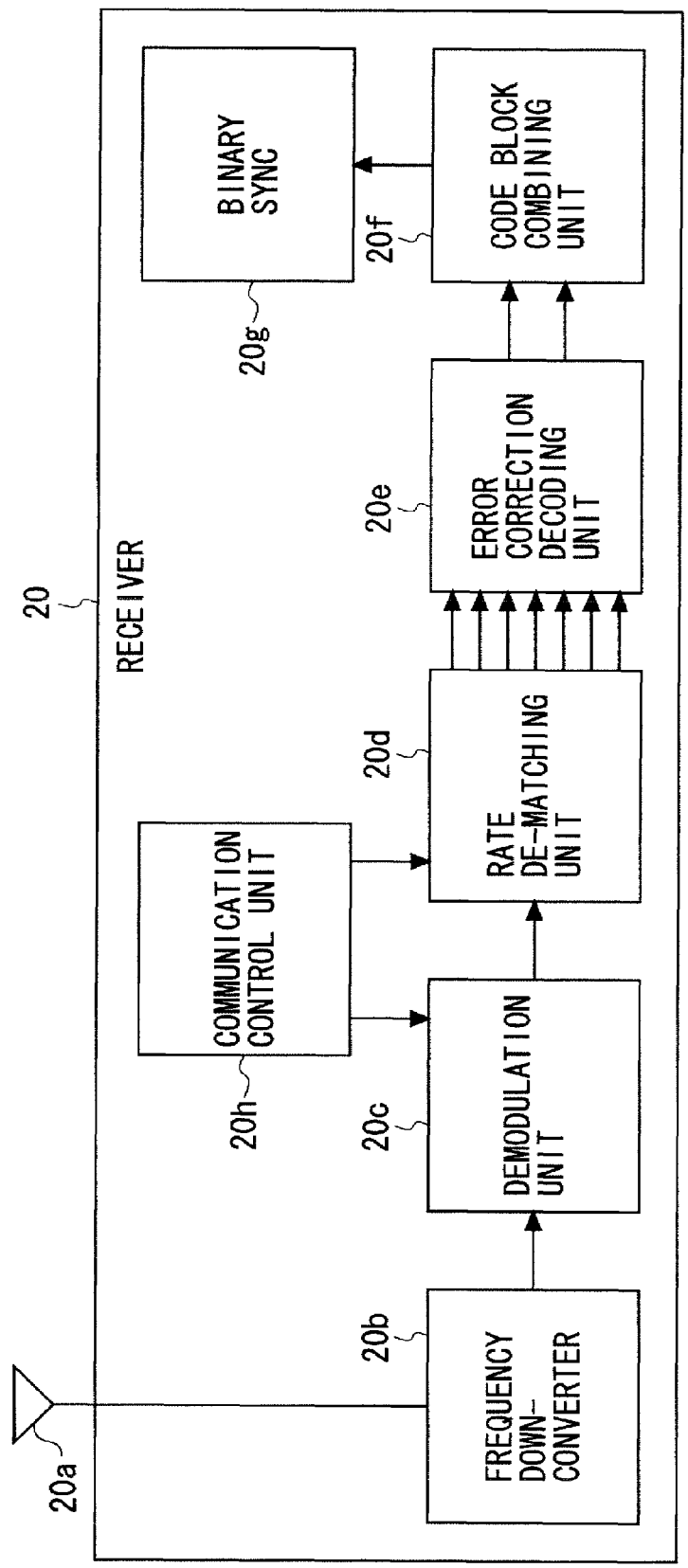
FIG. 10 is a diagram showing a configuration of a receiver.

FIG. 10 is a diagram showing a configuration of the receiver 20.

The receiver 20 includes an antenna 20a, a frequency down-converter 20b, a demodulation unit 20c, a rate de-matching unit 20d, an error correction decoding unit 20e, a code block combining unit 20f, a binary sync 20g, and a communication control unit 20h.

When an electric wave is sensed, the antenna 20a converts the electric wave to an electrical signal. The frequency down-converter 20b down-converts the frequency of a modulated carrier signal input from the antenna 20a.

The demodulation unit 20c performs demodulation of extracting a bit sequence as a baseband signal from the down-converted modulated carrier signal. The demodulation method can be changed according to an instruction from the communication control unit 20h.

The rate de-matching unit 20d separates the systematic codes corresponding to the first and second code blocks and the redundant bit sequence from the bit sequence input from the demodulation unit 20c based on the encoding rate and the insertion rate notified from the communication control unit 20h. As described, which bits will be selected is determined in advance according to the values of the encoding rate and the insertion rate. Therefore, the rate de-matching unit 20d can separate the systematic codes and the redundant bit sequence from the input bit sequence based on the encoding rate and the insertion rate. The rate de-matching unit 20d also adjusts the number of bits of the separated systematic codes and redundant bit sequence. Specifically, the rate de-matching unit 20d supplements bits 0 to the positions where the bits are thinned out in the systematic codes to adjust the number of bits. The number 0 denotes that there is no information. This is because the probability that the transmission bit is 0 increases with an increase in the absolute value of a positive value, and the probability that the transmission bit is 1 increases with an increase in the absolute value of a negative value. Similarly, the rate de-matching unit 20*d* supplements bits 0 to the positions where the bits are thinned out in the redundant bit sequence to adjust the number of bits. The rate de-matching unit 20*d* outputs the systematic codes and the redundant bit sequence with adjusted number of bits to the error correction decoding unit 20*e*.

The error correction decoding unit 20*e* uses the systematic codes corresponding to the first and second code blocks to perform error correction decoding of the first and second code blocks. More specifically, the error correction decoding unit 20*e* corrects the code error when there is a code error in the first and second code blocks. A specific configuration of the error correction decoding unit 20*e* will be described later.

The code block combining unit 20*f* combines the first and second code blocks output from the error correction decoding unit 20*e* to generate a bit sequence.

The binary sync 20*g* receives the bit sequence output from the code block combining unit 20*f* as digital information and uses the received digital information to execute various processes. An example of the binary sync 20*g* includes a computer including a CPU, a storage unit, and a recording unit. Examples of the storage unit include a DRAM and an SRAM. Examples of the recording unit include an SSD apparatus, an HDD apparatus, a BD drive apparatus, a DVD drive apparatus, a +R/+RW drive apparatus, a CD drive apparatus, a memory card drive apparatus, and a flexible disk drive apparatus. Examples of the computer include a personal computer, a cell phone, and a PDA. Examples of the personal computer include a desktop PC, a notebook PC, a laptop PC, a pen computer, a netbook, and a wearable computer.

The communication control unit 20*h* receives information indicating the encoding rate and the modulation method from the transmitter 10 through the channel for control. The communication control unit 20*h* determines a demodulation method corresponding to the modulation method indicated by the received information and instructs the demodulation unit 20*c* for the demodulation using the determined demodulation method. The communication control unit 20*h* also notifies the rate de-matching unit 20*d* of the received encoding rate. In a case of a mode in which the correspondence between the insertion rate of redundant bit sequence and the encoding rate is determined in advance in the transmitter 10 and the receiver 20, the communication control unit 20*h* specifies the insertion rate corresponding to the encoding rate and notifies the rate de-matching unit 20*d* of the insertion rate. In a case of a mode in which the communication control unit 10*h* of the transmitter 10 notifies the receiver 20 of the insertion rate of redundant bit sequence through the channel for control, the communication control unit 20*h* notifies the rate de-matching unit 20*d* of the received insertion rate.

Figure 11:
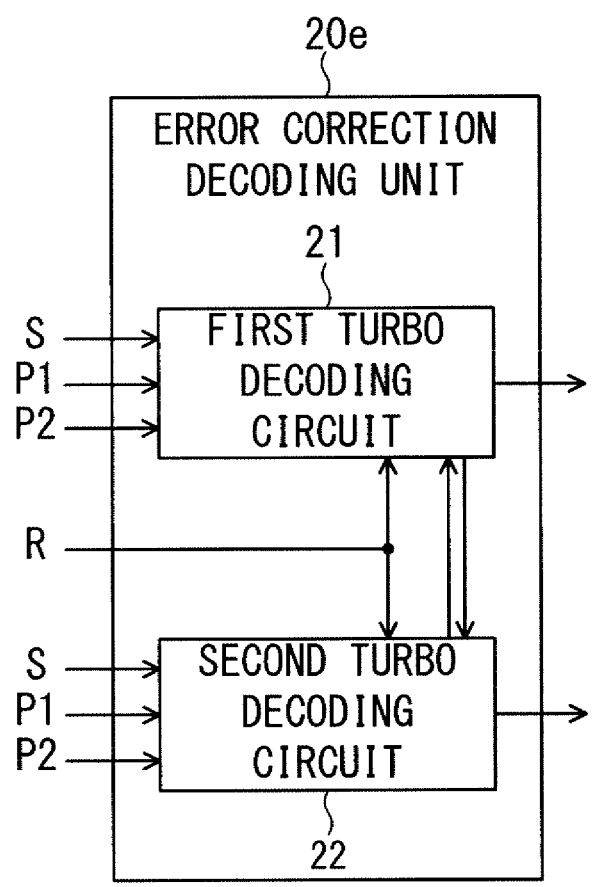
FIG. 11 is a diagram showing a configuration of an error correction decoding unit.

FIG. 11 is a diagram showing a configuration of the error correction decoding unit 20*e*.

The error correction decoding unit 20*e* includes a first turbo decoding circuit 21 and a second turbo decoding circuit 22. The first and second turbo decoding circuits 21 and 22 perform turbo decoding to the systematic codes input from the rate de-matching unit 20*d*. Here, the first and second turbo decoding circuits 21 and 22 establish the systematic bit sequence by acquiring the reliability that the bit is "1" or "0" for each bit in the systematic bit sequence through turbo processing described later. A conventional turbo decoding circuit is configured to use systematic codes input to its circuit to generate a systematic bit sequence without code error. More specifically, decoding is performed for each turbo-encoded individual data block. Meanwhile, in the present embodiment, the first and second turbo decoding circuits 21 and 22 mutually transfer results of the turbo processing described later in a process of repetitive codes of data blocks of turbo codes input to the circuits. For each repetitive decoding, the first and second turbo decoding circuits 21 and 22 are configured to further execute a process of repeating the next repetitive decoding based on the mutually received decoding results of the counterparts and the redundant bit sequence received from the transmitter 10 to further increase the reliability of the state of the bits ("1" or "0").

Figure 12:
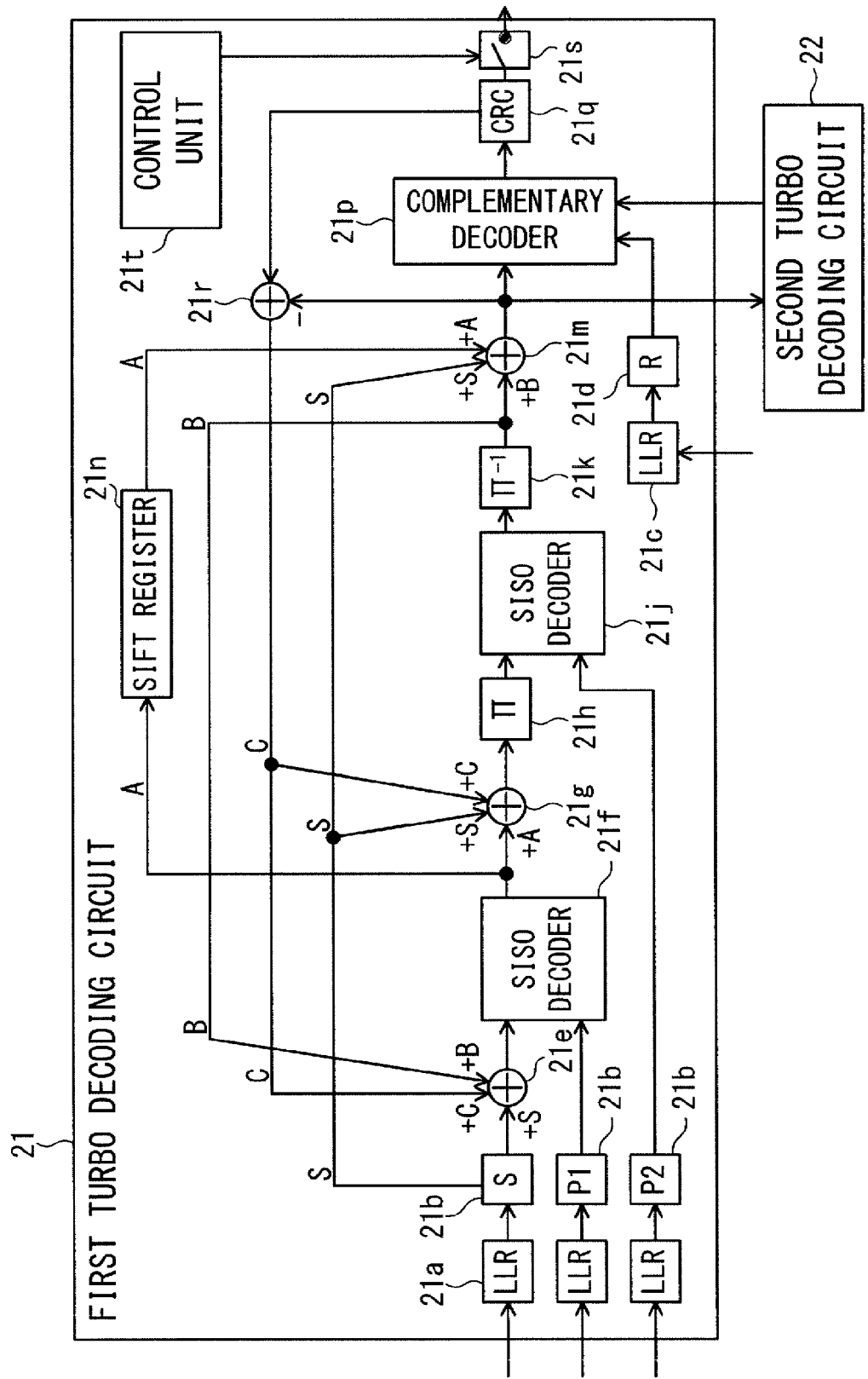
FIG. 12 is a diagram showing a configuration of a first turbo decoding circuit.

FIG. 12 is a diagram showing a configuration of the first turbo decoding circuit 21.

The first turbo decoding circuit 21 includes three log-likelihood ratio calculators 21*a* and three registers 21*b*. When the systematic codes are input from the rate de-matching unit 20*d*, the three log-likelihood ratio calculators 21*a* calculate a log-likelihood ratio (LLR) of each bit in the systematic bit sequence, the first check bit sequence, and the second check bit sequence included in the systematic codes. The three registers 21*b* record the calculated log-likelihood ratios. The first turbo decoding circuit 21 includes one log-likelihood ratio calculator 21*c* and one register 21*d*. When a redundant bit sequence is input from the rate de-matching unit 20*d*, the log-likelihood ratio calculator 21*c* calculates the log-likelihood ratio of each bit in the redundant bit sequence. The register 21*d* records the calculated log-likelihood ratios. Here, the log-likelihood ratio denotes a natural log of a ratio between the probability that the bit is "1" and the probability that the bit is "0".

Corresponding to the first turbo encoding circuit 13 shown in FIG. 4 including two RSC encoding units 13*a* and 13*c*, the first turbo decoding circuit 21 includes two SISO [Soft-Input Soft-Output] decoders 21*f* and 21*j*.

The first SISO decoder 21*f* performs calculation based on input values and outputs extrinsic information A. The input values include a priori log-likelihood ratio (Priori LLR) of each bit and the log-likelihood ratio of each bit in the register 21*b* for the first check bit sequence. The priori log-likelihood ratio is a sum of the log-likelihood ratio in the register 21*b* for systematic bit sequence, extrinsic information B described later output from the second SISO decoder 21*j*, and extrinsic information C output from a complementary decoder 21*p* described later. The first SISO decoder 21*f* uses the input values as the priori log-likelihood ratio to calculate a posterior log-likelihood ratio (Posterior LLR). Here, the priori log-likelihood ratio denotes a natural log of a ratio between the prior probability that the bit is "1" and the prior probability that the bit is "0". The posterior log-likelihood ratio denotes a natural log of a ratio between the posterior probability that the bit is "1" and the posterior probability that the bit is "0". The prior probability denotes, for example, the probability of the occurrence of an event A with respect to an event B before information of the occurrence of the event B is obtained. In the present embodiment, the prior probability denotes the probability of transmission of a bit in a certain state. Alternatively, the prior probability can be illustrated as the probability that a bit in received data is 1 or 0. The posterior probability generally denotes the probability of the occurrence of an event A after information of the occurrence of an event B is obtained. In the present embodiment, the posterior probability denotes the probability of transmission of a bit in a certain state under the condition that the bit in the state is received. The first SISO decoder 21f calculates the posterior log-likelihood ratio as a result of soft decision decoding and then outputs, as the extrinsic information A, an increment of the calculated posterior log-likelihood ratio relative to the priori log-likelihood ratio. Therefore, the first SISO decoder 21f functions as the element decoder. The first SISO decoder 21f is an example of the first decoder.

Figure 13:
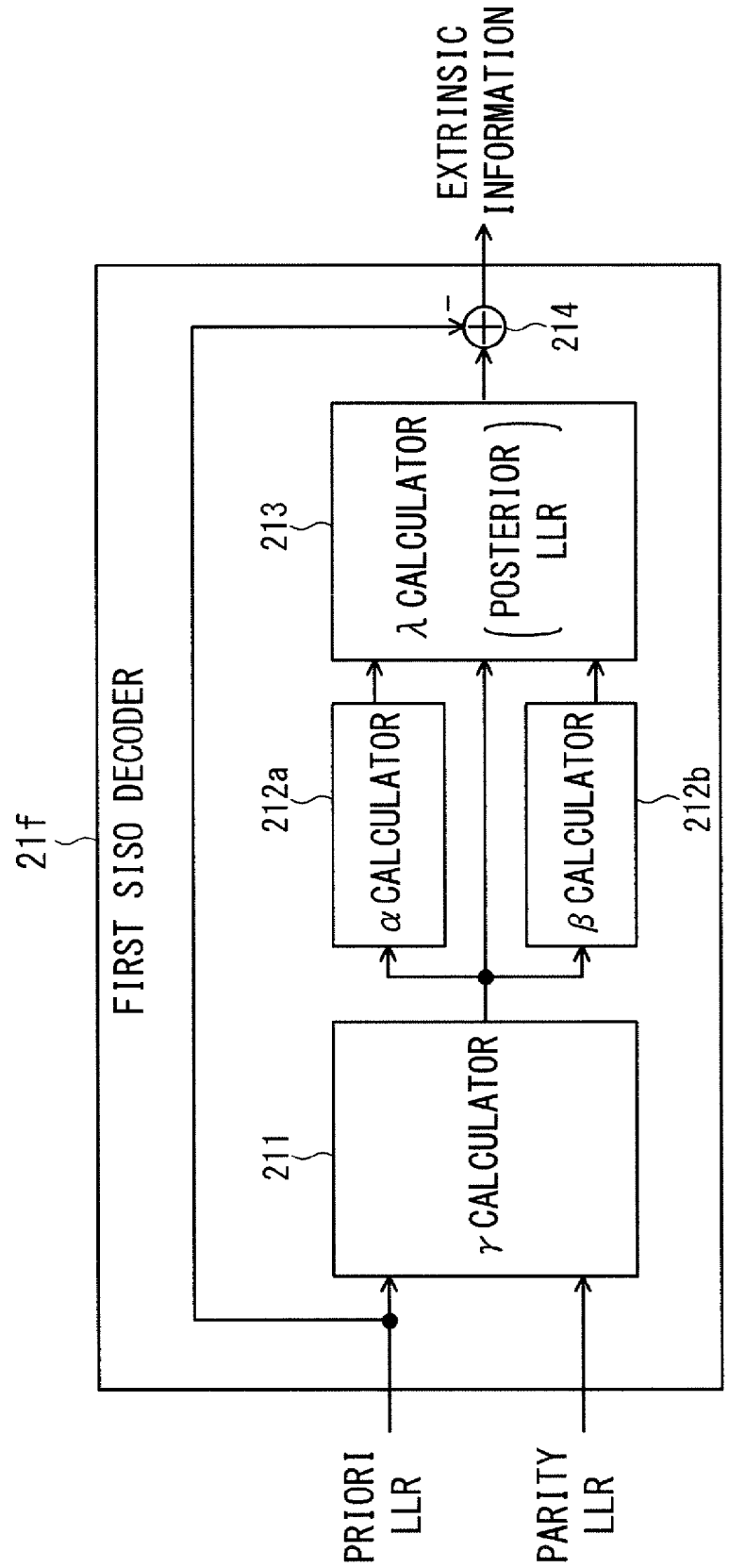
FIG. 13 is a diagram showing a configuration of a first SISO decoder.

Specifically, the first SISO decoder 21f includes a γ calculator 211, an α calculator 212a, a β calculator 212b, a λ calculator 213, and an m-bit adder 214 as illustrated in FIG. 13. The γ calculator 211 calculates a transfer probability γ of each bit based on the priori log-likelihood ratio of each bit and the log-likelihood ratio of each bit in the register 21b for first check bit sequence. The α calculator 212a calculates a forward probability α of each bit based on the transfer probability γ of each bit output from the γ calculator 211. The β calculator 212b calculates a backward probability β of each bit based on the transfer probability γ of each bit output from the γ calculator 211. The λ calculator 213 calculates the posterior log-likelihood ratio based on the transfer probability γ, the forward probability α, and the backward probability β output from the γ calculator 211, the α calculator 212a, and the β calculator 212b. The m-bit adder 214 subtracts the priori log-likelihood ratio of each bit input to the γ calculator 211 from the posterior log-likelihood ratio of each bit output from the λ calculator 213 to generate extrinsic information. Therefore, the first SISO decoder 21f illustrated in FIG. 13 is configured to perform MAP [Maximum A Posteriori] calculation. The configuration illustrated in FIG. 13 is also disclosed in, for example, Japanese Patent Laid-Open No. 2005-108332. The first SISO decoder 21f may also be configured to perform SOVA [Soft-Output Viterbi Algorithm] calculation.

In the present embodiment, the second SISO decoder 21j shown in FIG. 12 also has a configuration as illustrated in FIG. 13 and performs similar calculation as the first SISO decoder 21f. More specifically, the second SISO decoder 21j performs calculation based on the input values and outputs the extrinsic information B as an increment of the posterior log-likelihood ratio relative to the priori log-likelihood ratio. Therefore, the second SISO decoder 21j also functions as the element decoder. The input values include the priori log-likelihood ratio of each bit and the log-likelihood ratio of each bit in the register 21b for second check bit sequence. The priori log-likelihood ratio is a sum of the log-likelihood ratio of each bit in the register 21b for systematic bit sequence, the extrinsic information A of each bit output from the first SISO decoder 21f, and the extrinsic information C of each bit output from the complementary decoder 21p described later. The second SISO decoder 21j is an example of the second decoder.

In the first turbo decoding circuit 21, the first and second SISO decoders 21f and 21j are configured to repeat exchanging the extrinsic information for predetermined times according to the control of a control unit 21t. The posterior log-likelihood ratio would gradually improved by exchanging the extrinsic information. The process of improving the posterior log-likelihood ratio by exchanging the extrinsic information is called turbo processing. After the repetitions of exchanging the extrinsic information by the first and second SISO decoders 21f and 21j for predetermined times, a CRC unit 21q establishes values of the bits of the systematic bit sequence through hard decision processing based on the posterior log-likelihood ratio. The control unit 21t asserts an enable signal for an output signal control switch 21s. As a result, the systematic bit sequence established by the CRC unit 21q is output through the CRC output signal control switch 21s.

The first turbo decoding circuit 21 also includes an interleaving unit (Π) 21h and a deinterleaving unit (Π-1) 21k. The interleaving unit 21h arranges the alignment sequence of the priori log-likelihood ratios of the bits input to the second SISO decoder 21j into the same sequence as the alignment sequence of the bits of the second check bit sequence input to the second SISO decoder 21j. The changing method, that is, the shuffling method of the alignment sequence of the bits by the interleaving unit 21h is determined in advance so that the method is the same between the transmitter 10 and the receiver 20. The deinterleaving unit 21k returns the alignment sequence of the extrinsic information of the bits output from the second SISO decoder 21j to the alignment sequence of the priori log-likelihood ratio of the bits input to the first SISO decoder 21f.

The first turbo decoding circuit 21 also includes four m-bit adders 21e, 21g, 21m, and 21r. The first m-bit adder 21e adds the extrinsic information B and the extrinsic information C described later to the log-likelihood ratio of each bit in the register 21b for systematic bit sequence to generate the priori log-likelihood ratio of the first SISO decoder 21f. The second m-bit adder 21g adds a log-likelihood ratio S in the register 21b for systematic bit sequence and the extrinsic information C described later to the extrinsic information A of each bit output from the first SISO decoder 21f to generate the priori log-likelihood ratio of the second SISO decoder 21j. The third m-bit adder 21m adds the log-likelihood ratio S in the register 21b for systematic bit sequence and the extrinsic information A to the extrinsic information B of each bit output from the second SISO decoder 21j and deinterleaved by the deinterleaving unit 21k. The fourth m-bit adder 21r subtracts the log-likelihood ratio of each bit output from the third m-bit adder 21m from the log-likelihood ratio of each bit output from the CRC unit 21q described later to output the extrinsic information C. The extrinsic information C is an increment of the posterior log-likelihood ratio relative to the priori log-likelihood ratio in the complementary decoder 21p described later. Therefore, the complementary decoder 21p described later, the CRC unit 21q described later, and the fourth m-bit adder 21r as a whole function as one element decoder that outputs the extrinsic information C. The third m-bit adder 21m generates the priori log-likelihood ratio of the element decoder.

The first turbo decoding circuit 21 also includes a shift register 21n. The shift register 21n records the extrinsic information A output from the first SISO decoder 21f. The shift register 21n waits to output the extrinsic information A until the extrinsic information B is output from the second SISO decoder 21j and deinterleaved by the deinterleaving unit 21k and then outputs the extrinsic information A. In other words, the shift register 21n is configured to input, to the third m-bit adder 21m, the same value as the extrinsic information A input to the second SISO decoder 21j.

Figure 14:
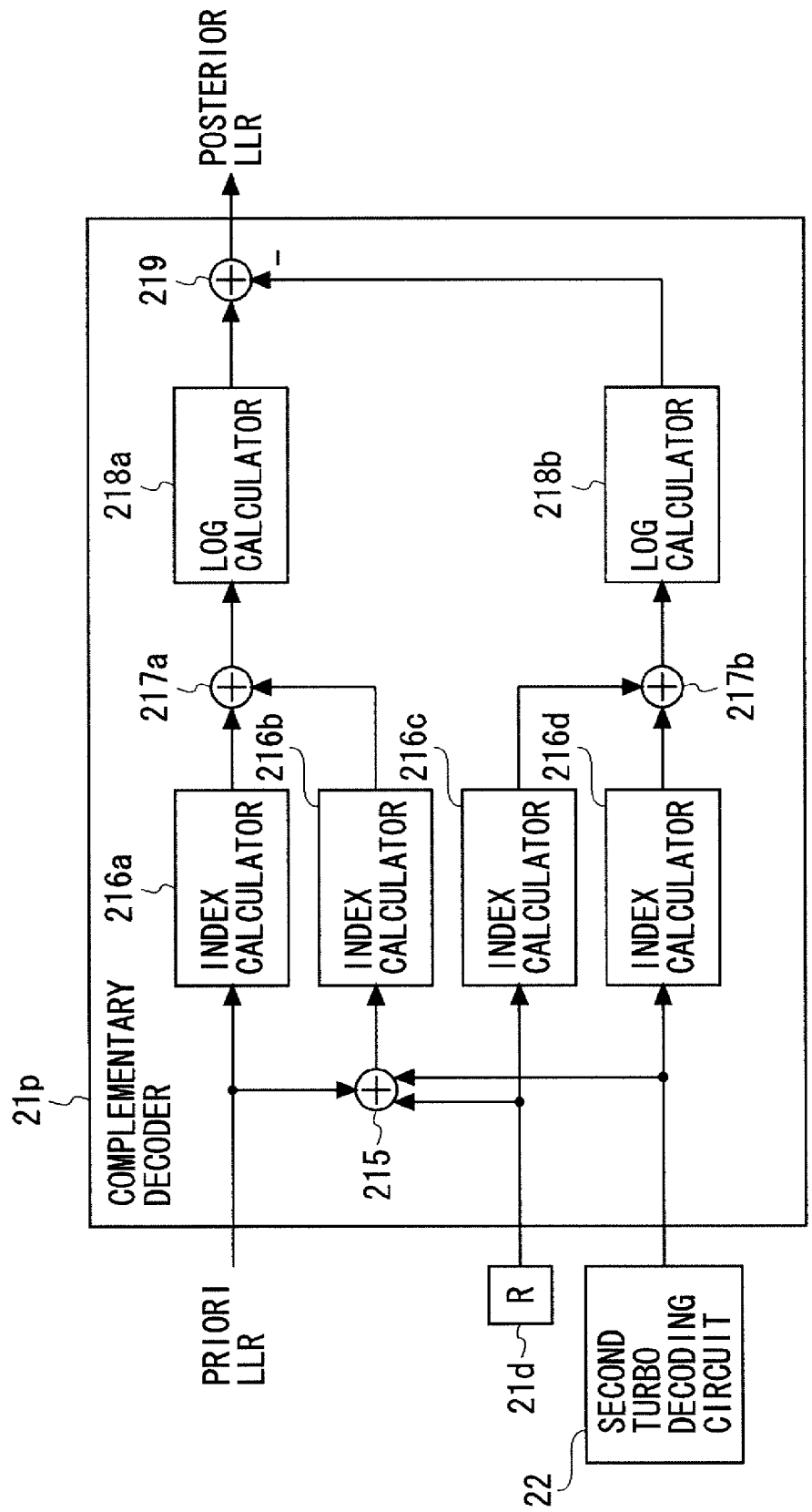
FIG. 14 is a diagram showing a configuration of a complementary decoder.

The first turbo decoding circuit 21 also includes the complementary decoder 21p. The complementary decoder 21p performs calculation based on the input values and outputs the posterior log-likelihood ratio. The input values include the posterior log-likelihood ratio of each bit output from the third m-bit adder 21m, the posterior log-likelihood ratio of each bit output from the third m-bit adder of the second turbo decoding circuit 22, and the log-likelihood ratio of each bit in the register 21d for redundant bit sequence. Specifically, as illustrated in FIG. 14, the complementary decoder 21*p* includes a first m-bit adder 215, four index calculators 216*a* to 216*d*, second and third m-bit adders 217*a* and 217*b*, two log calculators 218*a* and 218*b*, and a fourth m-bit adder 219. The first m-bit adder 215 adds the input values and outputs the input values to the second index calculator 216*b*. The posterior log-likelihood ratio (A+B+S) of each bit output from the third m-bit adder 21*m* of FIG. 12 is input to the first index calculator 216*a*. Hereinafter, let x1 be the posterior log-likelihood ratio A+B+S of each bit output from the third m-bit adder 21*m* of FIG. 12. The log-likelihood ratio of each bit in the register 21*d* for redundant bit sequence is input to the third index calculator 216*c*. The posterior log-likelihood ratio (A+B+S) of each bit output from the third m-bit adder of the second turbo decoding circuit 22 is input to the fourth index calculator 216*d*. Hereinafter, let x2 be the posterior log-likelihood ratio A+B+S of each bit output from the third m-bit adder of the second turbo decoding circuit 22. The first to fourth index calculators 216*a* to 216*d* form an index of the input log-likelihood ratio of each bit to convert the ratio to a value that is a power of a Napier's constant e, that is, a likelihood ratio. The second m-bit adder 217*a* adds the likelihood ratios output from the first and second index calculators 216*a* and 216*b* and outputs the likelihood ratios to the first log calculator 218*a*. The third m-bit adder 217*b* adds the likelihood ratios output from the third and fourth index calculators 216*c* and 216*d* and outputs the likelihood ratios to the second log calculator 218*b*. The first and second log calculators 218*a* and 218*b* calculate natural logs of the input likelihood ratios of the bits and convert the likelihood ratios to log-likelihood ratios. The fourth m-bit adder 219 subtracts the log-likelihood ratio output from the second log calculator 218*b* from the log-likelihood ratio output from the first log calculator 218*a* and outputs the log-likelihood ratio.

The content of the calculation by the complementary decoder 21*p* illustrated in FIG. 14 is expressed by the following Formula (1).

[Expression 1]

$$\ln(\exp(x1+x2+y)+\exp(x1))-\ln(\exp(x2)+\exp(y)) \quad (1)$$

In Formula (1), x1 denotes the posterior log-likelihood ratio output from the third m-bit adder 21*m* of FIG. 12. Furthermore, x2 denotes the posterior log-likelihood ratio output from the third m-bit adder of the second turbo decoding circuit 22, and y denotes the log-likelihood ratio of the redundant bits.

Here, the derivation of Formula (1) will be described. First, let P(0) be the probability of the state of one bit being "0" and let P(1) be the probability of the state of one bit being "1", so the log-likelihood ratio is expressed by ln{P(0)/P(1)}. The log-likelihood ratio is positive infinity when the target bit is 0, and the log-likelihood ratio is negative infinity when the bit x1 is 1. The log-likelihood ratio is 0 when the probability of the bit x1 being 0 or 1 is 50%.

Since there are only two bit states, "1" and "0", P(1)=1−P(0). When these formulas are used, a log-likelihood ratio x can be expressed by x=ln[P(0)/{1−P(0)}]. Here, the log-likelihood ratio is X and indices on both sides are calculated, so the following Formula (2) is obtained.

$$\exp(X) = [P(0)/\{1-P(0)\}] \quad (2)$$

When Formula (2) is solved for P(0), the following Formula (3) is obtained.

$$P(0) = \exp(X)/\{1+\exp(X)\} \quad (3)$$

Since P(1)=1−P(0), P(1) is as in the following Formula (4).

$$P(1) = 1/\{1+\exp(X)\} \quad (4)$$

Here, P(0)/P(1) denotes a likelihood ratio, and in the calculation of the likelihood ratio, just the relationship between the likelihood of the state of "1" and the likelihood of the state of "0" needs to be clear. Therefore, the discussion will now be advanced in view of the fact that the denominators of Formula (3) and Formula (4) are the same, regarding the likelihood of the state of "0" as exp(X), and regarding the likelihood of the state of "1" as 1.

In the following description, the bits estimated by the log-likelihood ratios x1 and x2 will be simply called bits x1 and x2. In the present embodiment, the redundant bits are generated by calculating the exclusive OR of the bits of the same position in the order from the top in the first and second code blocks. In light of this, combinations of (x1, x2, y) when the bit x1 of the first code block is in the state of "0" include (0, 0, 0) and (0, 1, 1), and combinations of (x1, x2, y) when the bit x1 is in the state of "1" include (1, 1, 0) and (1, 0, 1). Therefore, the likelihood that the bit x1 is in the state of "0" is a sum of the likelihood of (0, 0, 0) and the likelihood of (0, 1, 1), and the likelihood that the bit x1 is in the state of "1" is a sum of the likelihood of (1, 1, 0) and the likelihood of (1, 0, 1). Here, for example, the likelihood of (0, 1, 1) is a combination of exp(x1) that is a likelihood that the bit x1 is in the state of "0", 1 that is a likelihood that the bit x2 is in the state of "1", and 1 that is a likelihood that the bit y is in the state of "1". Since the combined likelihood is expressed by a multiplication of likelihoods, the likelihood of (0, 1, 1) is expressed by exp(x1). From this, the likelihood that the bit x1 is in the state of "0" is exp(x1+x2+y)+exp(x1), and the likelihood that the bit x1 is in the state of "1" is exp(y)+exp(x2). Therefore, the posterior log-likelihood ratio of the bit x1 when the combination of (x1, x2, y) is provided as a priori log-likelihood ratio is expressed by Formula (1).

The process by the complementary decoder 21*p* when the redundant bits are created by exclusive OR of the bits of the same position in the order from the top in the first and second code blocks has been illustrated here. However, when the redundant bits are generated by another bit calculation method, the calculation procedure of the complementary decoder 21*p* may be implemented according to the bit calculation method for generating the redundant bits. In other words, when the first turbo decoding circuit 21 obtains the posterior log-likelihood ratio of the first code block x1=A+B+C and the second turbo decoding circuit 22 obtains the posterior log-likelihood ratio of the second code block x2=A+B+C, the log-likelihood x1 can be set as a prior value, and the posterior log-likelihood can be calculated based on the log-likelihood x2 and the redundant bits.

The posterior log-likelihood ratio calculation process for each bit of the data block of the first turbo decoding circuit 21 is a process using all bits of the first code block. The same applies to the posterior log-likelihood ratio calculation process for each bit of the data block of the second turbo decoding circuit 22.

Meanwhile, the complementary decoder 21*p* calculates the posterior log-likelihood ratio of each bit of the data blocks based on each bit of the data blocks involved in the creation of the redundant bits and based on the redundant bits. Therefore, for example, the first turbo decoding circuit 21 can obtain the processing result of the second code block in the second turbo decoding circuit 22, that is, the posterior log-likelihood x2, that cannot be obtained in the conventional turbo decoding process and can further improve the accuracy of the posterior log-likelihood x1 of each bit of the first code block. Similarly, the second turbo decoding circuit 22 can obtain the processing result of the first code block in the first turbo decoding circuit 21, that is, the posterior log-likelihood x1 that cannot be obtained in the conventional turbo decoding process, and can further improve the accuracy of the posterior log-likelihood x2 of each bit of the second code block.

As shown in FIG. 12, the first turbo decoding circuit 21 also includes the CRC unit 21q. The CRC unit 21q is an example of the CRC calculation unit. The CRC unit 21q performs CRC for a bit sequence for which the state is estimated by the posterior log-likelihood ratio output from the complementary decoder 21p. More specifically, the CRC unit 21q divides a polynomial expressing the bit sequence by a predetermined generator polynomial and determines whether the remainder of the division matches the CRC code. If the remainder of the division does not match the CRC code, that is, if a code error is detected, the CRC unit 21q outputs the posterior log-likelihood ratio of each bit output from the complementary decoder 21p to the fourth m-bit adder 21r. On the other hand, if the remainder of the division matches the CRC code, that is, if a code error is not detected, the CRC unit 21q changes the absolute value of the posterior log-likelihood ratio of each bit to the maximum and outputs the posterior log-likelihood ratio to the fourth m-bit adder 21r. The reason that the absolute value of the posterior log-likelihood ratio is changed to the maximum is to reflect the result of decision in the CRC obtained by the CRC unit 21q, that is, hard decision result, on the log-likelihood ratio.

The posterior log-likelihood ratio is zero if the reliability of the state of the bit is split fifty-fifty between "1" and "0", and the posterior log-likelihood ratio theoretically approaches positive or negative infinity with an increase in the reliability that the bit is "0" or "1". However, the actual maximum value of the posterior log-likelihood ratio is a value such as 64 or 128 due to limitations on the process or hardware. After the log-likelihood ratios are recorded in the four registers 21b and 21d, the CRC unit 21q executes the determination process and the output process until the number of inputs of the posterior log-likelihood ratios from the complementary decoder 21p reaches a predetermined number, for example, eight times, in accordance with the control by the control unit 21t. In a word, the control unit 21t functions as a counter that counts the number of inputs of the posterior log-likelihood ratio from the complementary decoder 21p. After the log-likelihood ratios are recorded in the four registers 21b and 21d, the CRC unit 21q performs hard decision for the posterior log-likelihood ratio of each bit in accordance with the control by the control unit 21t when the number of inputs of the posterior log-likelihood ratios from the complementary decoder 21p reaches the predetermined number. More specifically, the CRC unit 21q determines the state of each bit ("1" or "0") depending on whether the posterior log-likelihood ratio exceeds a predetermined threshold, for example, zero. Subsequently, the control unit 21t asserts and enables the CRC output signal control switch 21s, and the CRC unit 21q handles the bit sequence with bits in determined states as the first code block without code error and outputs the bit sequence to the code block combining unit 20f shown in FIG. 10. The CRC unit 21q is an example of the output unit.

Figure 16:
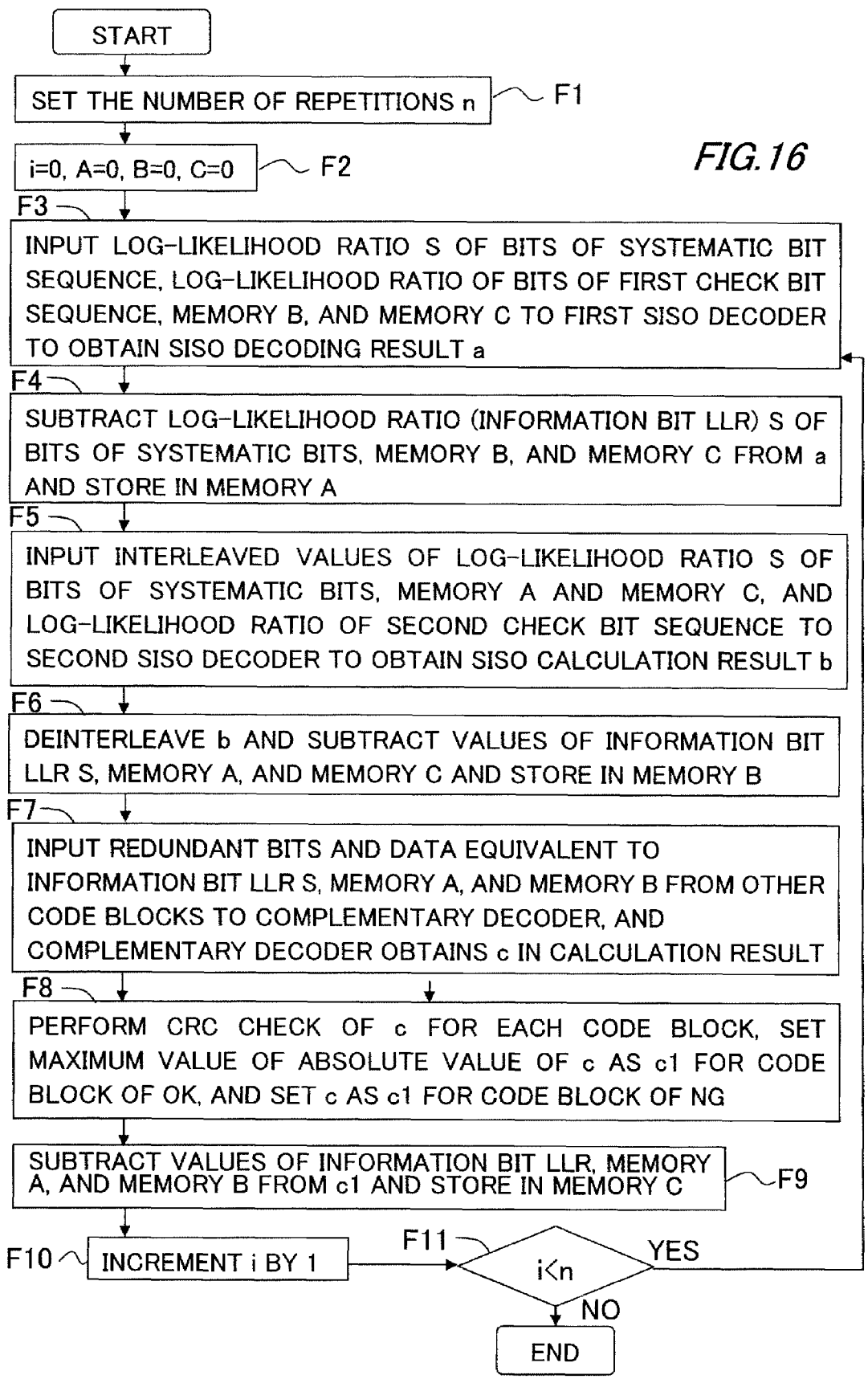
FIG. 16 is a flow chart showing a turbo decoding process executed by a first turbo decoding circuit 21.

FIG. 16 is a flow chart showing the turbo decoding process executed by the first turbo decoding circuit 21. In the process, the control unit 21t first sets a predetermined value as a number of repetitions "n" (F1). The predetermined value may be, for example, a parameter value set by a user from outside. The control unit 21t initializes values of a number of executions counter "i", a memory A, a memory B, and a memory C to 0 (F2). The control unit 21t may be configured to function by executing a computer program expanded to be executable on a memory. The control unit 21t may be a control circuit that counts the initial setting of F1 and F2 and the number of executions to determine whether the value has reached the predetermined value. The value of the memory A is an example of the incremental value, that is, the extrinsic information, of the posterior log-likelihood ratio output by the first SISO decoder 21f. The value of the memory B is an example of the incremental value, that is, the extrinsic information, of the posterior log-likelihood ratio output by the second SISO decoder 21j. The value of the memory C is an example of the incremental value, that is, the extrinsic information, of the posterior log-likelihood ratio output by the complementary decoder 21p. The log-likelihood ratio calculator 21a calculates the log-log-likelihood ratio S from the currently processed bit in the systematic bit sequence.

Next, the first SISO decoder 21f inputs values of the log-log-likelihood ratio S calculated from the currently processed bit of the systematic bit sequence, the first check bit sequence, the memory B, and the memory C to obtain an SISO decoding result "a" (F3). The SISO decoding result "a" is equivalent to the posterior log-likelihood ratio with respect to the bit in the input systematic bits. Hereinafter, the posterior log-likelihood ratio with respect to the bit in the input systematic bits will be called information bit LLR. The first SISO decoder 21f subtracts values of the log-log-likelihood ratio S, the memory B, and the memory C from the information bit LLR and stores the value as a new incremental value in the memory A (F4). The total value of the log-log-likelihood ratio S, the memory B, and the memory C is equivalent to the priori log-likelihood ratio.

Next, the second SISO decoder 21j inputs interleaved values of the log-log-likelihood ratio S, the memory A, and the memory C as well as the second check bit sequence to obtain an SISO decoding result "b" (F5). The second SISO decoder 21j deinterleaves the decoding result "b", subtracts the values of information bit LLR S, the memory A, and the memory C, and stores the value as a new incremental value in the memory B (F6).

Next, the complementary decoder 21p inputs the log-log-likelihood ratio based on the redundant bits and data equivalent to the memory A, the memory B, and the information bit LLR S from all code blocks to obtain a calculation result "c". The calculation result "c" denotes a log-log-likelihood ratio of an information bit reflecting the redundant bit that is a check bit between code blocks.

Next, the CRC unit 21q executes CRC of the calculation result c. If the CRC result indicates that there is no error, the CRC unit 21q sets the absolute value of c to the maximum value and stores the value in a memory c1. On the other hand, if the CRC result indicates an error, the CRC unit 21q stores the value of c in the memory c1 (F8).

Next, the m-bit adder 21r subtracts values of the information bit LLR S, the memory A, and the memory B from the memory c1 and stores the value as a new incremental value in the memory C (F9). The control unit 21t increments the counter "i" by 1 (F10). The control unit 21t determines whether the counter "i" has exceeded the number of repetitions "n" (F11). If the counter "i" has not exceeded the number of repetitions "n", the control unit 21t controls the first turbo decoding circuit 21 to the process F3. On the other hand, if the counter "i" has exceeded the number of repetitions "n", the control unit 21t asserts and enables the CRC output signal control switch 21s and outputs the hard decision result by the CRC unit 21q. The foregoing process can be similarly executed by the decoding circuits for other code blocks, such as the second turbo decoding circuit 22.

In the first embodiment, the process of FIG. 16 is described as a process executed by the hardware circuit of FIGS. 12 to 14. However, for example, a processor such as a CPU and a DSP (Digital Signal Processor) can execute a computer program expanded to be executable on the memory to execute the process of FIG. 16.

Advantageous Effects

According to the transmitter 10 of the present embodiment, the first and second turbo encoding circuits 13 and 14 apply turbo encoding to the first and second code blocks, and the redundant bit generation circuit 15 generates a redundant bit sequence for providing a correlation to the first and second code blocks. Therefore, the first and second code blocks are correlated by the redundant bits when turbo-encoded.

According to the first and second turbo decoding circuits 21 and 22 in the receiver 20 of the present embodiment, the first and second SISO decoders and the complementary decoder mutually supply the extrinsic information, instead of the first and second SISO decoders mutually supplying the extrinsic information. Moreover, the complementary decoder handles the log-likelihood ratio output from the third m-bit adder, the log-likelihood ratio output from the third m-bit adder of another turbo decoding circuit, and the log-likelihood ratio of the redundant bit sequence as priori log-likelihood ratios to generate posterior log-likelihood ratios. In this way, the soft decision decoding of a turbo-encoded code block is performed not only based on information related to the code block, but also based on the results of soft decision decoding of other code blocks and the redundant bits correlated to other code blocks. Therefore, the probability of the correction of a code error from one of the first and second code blocks is higher than when the first and second code blocks are individually turbo-decoded.

Figure 15:
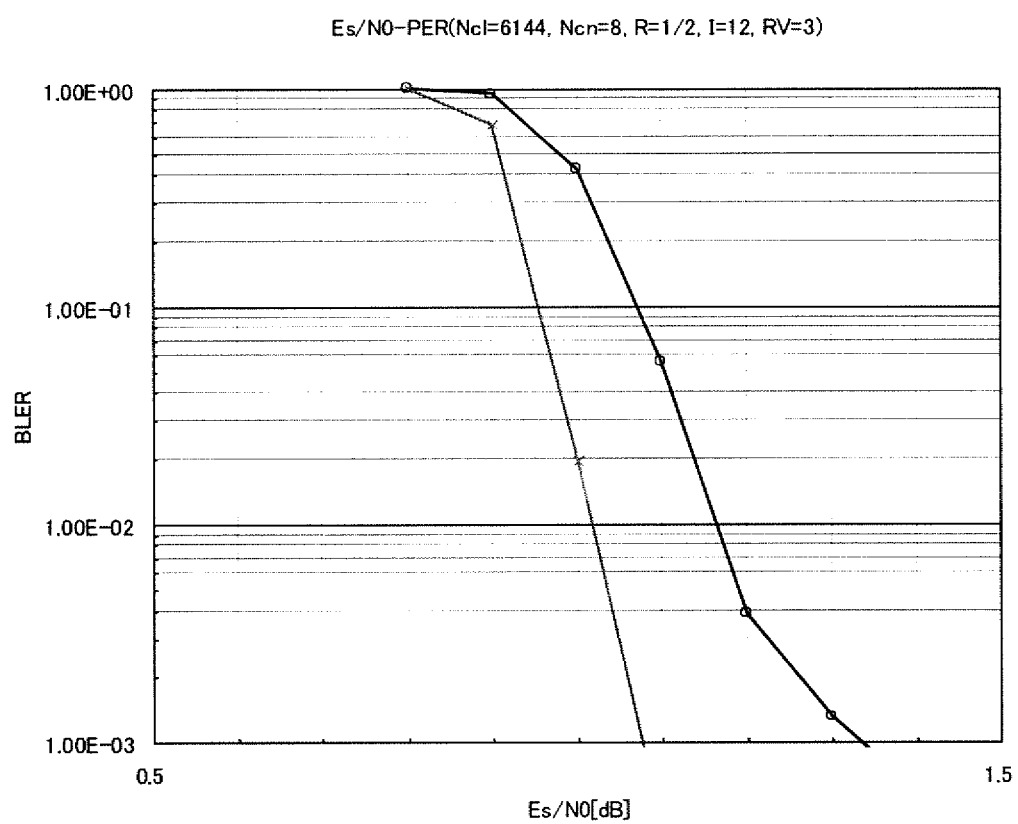
FIG. 15 is a diagram showing a graph of a relationship between a block error rate and an energy per symbol to noise density ratio.

FIG. 15 is a diagram showing a graph of a relationship between a block error rate and an energy per symbol to noise density ratio.

The graph shown in FIG. 15 denotes a simulation result when the number of code blocks is 8, and the encoding rate is ⅓ in an AWGN [Additive White Gaussian Noise] environment. In FIG. 15, the vertical axis denotes the block error rate, and the horizontal axis denotes the energy per symbol to noise density ratio. FIG. 15 shows two graphs. The graph on the right shows a measurement result in conventional turbo decoding circuit that includes the first and second SISO decoders and that does not include the complementary decoder. The graph on the left shows a measurement result in the turbo decoding circuit of the present embodiment that includes the first and second SISO decoders as well as the complementary decoder. As shown in FIG. 15, the block error rate of the present embodiment is equal to or less than ¹⁄₁₀ of the block error rate of the conventional example when the value of the horizontal axis, that is, the energy per symbol to noise density ratio, is one or greater.

In this way, according to the present embodiment, high error correction characteristics can be obtained. This improves the reliability of the digital communication in which the code block dividing process is executed.

According to the present embodiment, the redundant bit generation circuit 15 calculates the exclusive OR of the bits of the same position in the order from the top in the first and second code blocks. Therefore, the redundant bits can be generated with a simple circuit configuration. Therefore, the circuit size and the processing time rarely increase compared to the conventional turbo encoding circuit.

According to the present embodiment, the CRC unit 21q performs CRC every time the posterior log-likelihood ratio is generated. If the code error is not detected any more before the number of generations of the posterior log-likelihood ratios reaches the predetermined number of times, the CRC unit 21q sets the absolute value of the posterior log-likelihood ratio to the maximum and outputs the ratio to the fourth m-bit adder 21r. As a result, the log-likelihood ratio with the maximum absolute value is supplied to the complementary decoder of the other turbo decoding circuit. Therefore, the complementary decoder of the other turbo decoding circuit can use the highly reliable log-likelihood ratio to perform soft decision decoding before the number of generations of the posterior log-likelihood ratios reaches the predetermined number. As a result, the error correction decoding unit 20e can obtain high error correction characteristics.

More specifically, according to the receiver of the first embodiment, soft decision decoding of a turbo-encoded code block is performed not only based on the information related to the code block but also based on the results of soft decision decoding of other code blocks and the redundant bits correlated to other code blocks. Therefore, the probability of the correction of a code error from one of the plurality of code blocks is higher than when the code blocks are individually turbo-decoded.

The transmitter 10 and the receiver 20 of the present embodiment divide the information bit sequence into a plurality of code blocks and transfer the blocks. If the division is not performed, the transmitter 10 and the receiver 20 execute a process of repeating the same bits or omitting certain bits to match the number of bits in the error correction codes to the number of bits of the physical channel. If the number of bits of the error correction codes increases, the load of parameter calculations of the process of matching the number of bits in the error correction codes to the number of bits of the physical channel increases. The transmitter 10 and the receiver 20 of the present embodiment divide the information bit sequence into a plurality of code blocks. Therefore, the number of bits of one code block can be used to calculate parameters, and the calculated parameters can be diverted in each code block. The transmitter 10 and the receiver 20 of the present embodiment can suppress the load of the process of matching the number of bits in the error correction codes to the number of bits of the physical channel and increase the reliability of the error correction.

First Modified Embodiment

In the present embodiment described above, the code block dividing unit 10b of the transmitter 10 divides the bit sequence into two code blocks. Therefore, the error correction decoding unit 20e of the receiver 20 includes two turbo decoding circuits. If the code block dividing unit 10b of the transmitter 10 is configured to divide the bit sequence into three or more, the error correction decoding unit 20e of the receiver 20 includes the same number of turbo decoding circuits as the number of divisions. In such a mode, all other turbo decoding circuits input the log-likelihood ratios to the complementary decoder in the turbo decoding circuit.

For example, if the number of divisions is three, the redundant bits are generated by calculating the exclusive OR of the bits of the same position in the order from the top in the first to third code blocks. Here, if the log-likelihood ratio of the bit of the third code block is expressed as x3, combinations of (x1, x2, x3, and y) when the bit x1 of the first code block is in the state of "0" include (0, 0, 0, 0), (0, 0, 1, 1), (0, 1, 0, 1), and (0, 1, 1, 0). Combinations of (x1, x2, x3, y) when the bit x1 of the first code block is in the state of "1" include (1, 0, 0, 1), (1, 0, 1, 0), (1, 1, 0, 0), and (1, 1, 1, 1). Therefore, if the likelihood of the state of "0" is regarded as exp(X) and the likelihood of the state of "1" is regarded as 1, the likelihood that the bit x1 is in the state of "0" is, as in the discussion above, exp(x1+x2+x3+y)+exp(x1+x2)+exp(x1+x3)+exp(x1+y). The likelihood that the bit x1 is in the state of "1" is exp(x2+x3)+exp(x2+y)+exp(x3+y)+1. Therefore, if the number of divisions is three, the complementary decoder in each turbo decoding circuit performs the following calculation of Formula (5).

[Expression 2]

$$\ln(\exp(x1+x2+x3+y)+\exp(x1+x2)+\exp(x1+x3)+\exp(x1+y))-\ln(\exp(x2+x3)+\exp(x2+y)+\exp(x3+y)+1) \quad (5)$$

Second Modified Embodiment

In the present embodiment and the first modified embodiment described above, the complementary decoder is configured to perform calculations of Formula (1) or Formula (5). However, the amount of calculations of Formula (1) or Formula (5) is large, because calculations of converting the logs and the indices are needed as shown, for example, in FIG. 14. Therefore, the complementary decoder may be configured to perform the calculations of Formula (1) or Formula (5) based on a similar discussion as max-log-MAP. For example, Formula (1) can be expanded as in the following Formula (6).

[Expression 3]

$$\max(x2+y,0)\cdot\ln(1+\exp(-|2+y|))-\max(x2,y)\cdot\ln(1+\exp(-|x2-y|)) \quad (6)$$

Here, max(a, b, c, ...) denotes the maximum value in the aggregate (a, b, c, ...). If J in $\ln\{1+\exp(-|J|)\}$ is significantly large, $\ln\{1+\exp(-|J|)\}$ can be approximated to 1. Therefore, when this is used to modify Formula (6), the following Formula (7) can be obtained.

[Expression 4]

$$\max(x2+y,0)-\max(x2,y) \quad (7)$$

Formula (7) can be expanded to the following Formula (8).

[Expression 5]

$$\text{sgn}(x2\cdot y)\cdot\min(|x2|,|y|) \quad (8)$$

Here, sgn(Z) denotes a sign (+ or −) of Z. Furthermore, min(a, b, c, ...) denotes the minimum value in the aggregate (a, b, c, ...).

If the complementary decoder of each turbo decoding circuit is configured to perform the calculation of Formula (8), the amount of calculations is further reduced.

Third Modified Embodiment

In the first embodiment, the example of processing using the CRC unit 21q for the first turbo decoding circuit 21 is illustrated. However, in the first turbo decoding circuit 21 of the present embodiment, an error detection unit based on another block code may be used in place of the CRC unit 21q.

In the first embodiment, the process in which the first turbo decoding circuit 21 and the second turbo decoding circuit 22 execute decoding of the code blocks in parallel is described. However, for example, only one turbo decoding circuit may be included to reduce the circuit size. One turbo decoding circuit may sequentially process the plurality of code blocks to obtain information bits LLR Si, memories Ai, and memories Bi (i=1, 2, ... ) for the code blocks. Then, the complementary decoder 21p may perform calculation for each code block based on the redundant bits to perform the CRC by the CRC unit 21q. More specifically, although the process is a sequential process as a result of holding memories for storing the plurality of code blocks, the information bits LLR Si, the memories Ai, and the memories Bi, the circuit size of the decoding circuit can be reduced.

Second Embodiment

An encoding apparatus 50 and a decoding apparatus 60 according to a second embodiment will be described with reference to the drawings of FIGS. 17 to 21. In the present embodiment, the complementary decoder that calculates the log-likelihood ratios based on check bits between code blocks is applied to an error correction encoding unit and an error correction decoding unit based on a low density parity check code (hereinafter, LDPC). In the second embodiment, as in the first embodiment, the error correction encoding unit will be described as part of the transmitter, and the error correction decoding unit will be described as part of the receiver. Of the configurations of the transmitter and the receiver of the second embodiment, the configurations other than the error correction encoding unit and the error correction decoding unit based on the low density parity check code are the same as in the first embodiment. Therefore, of the constituent elements of the second embodiment, the same reference numerals are provided to the same constituent elements as in the first embodiment, and the description will be omitted.

A generator matrix G is used to perform encoding of LDPC. The generator matrix G is a matrix in which the number of columns is the number of information bits, and the number of rows is the number of information bits+the number of Parity bits. The information bits are set as a column vector s=(s1, s2, ... , sm), and the generator matrix G is multiplied by the column vector s from the left. In this way, a transmission sequence Z (information bits+Parity bits) is obtained by Z=sG. However, the generator matrix G satisfies $GH^t=0$ with respect to a check matrix H. Here, $H^t$ denotes a transposed matrix of a check matrix H. Therefore, $HZ^t=ZH^t=sGH^t=0$, and the transmission sequence Z satisfies the check formula based on the check matrix.

Figure 17:
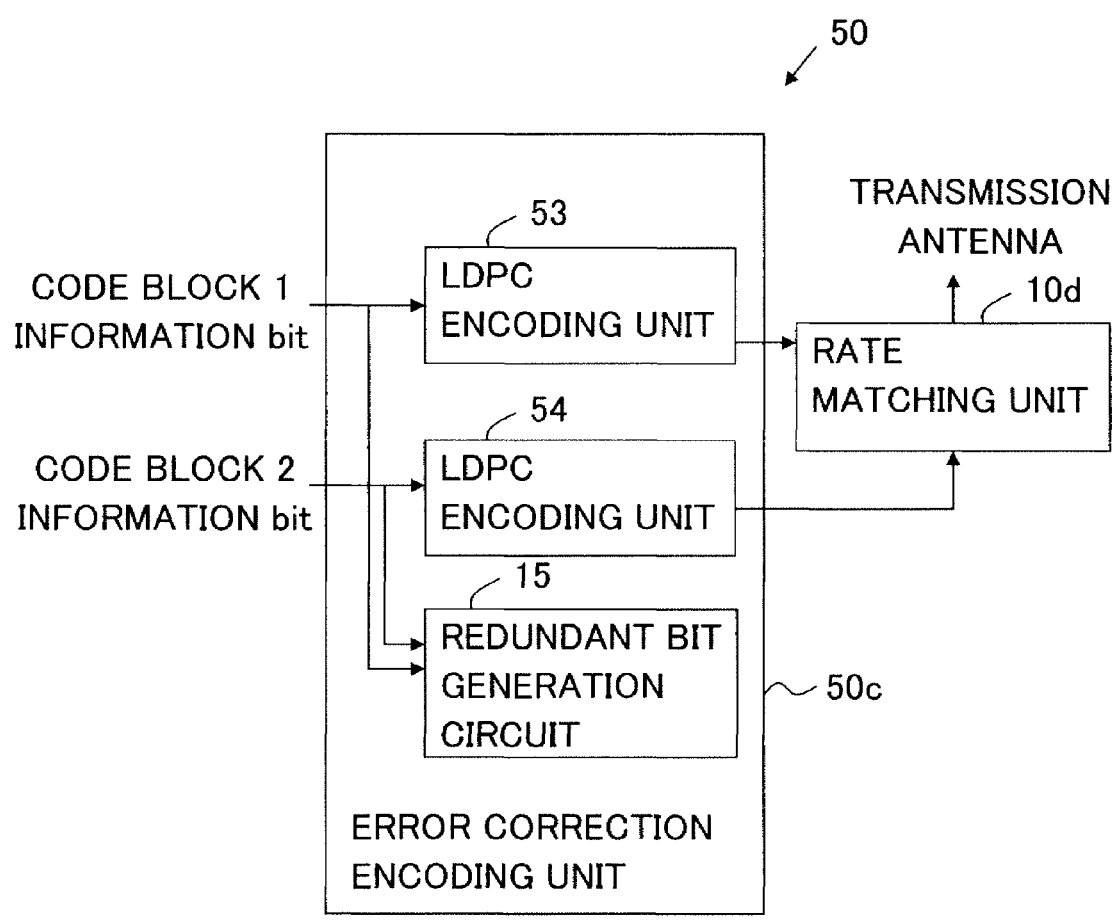
FIG. 17 is a diagram illustrating a configuration of a transmitter according to a second embodiment.

FIG. 17 shows the transmitter 50 according to the second embodiment. Of the configurations of the transmitter 50, FIG. 17 illustrates an error correction encoding unit 50c and the rate matching unit 10d. Therefore, in FIG. 17, the configurations on the binary source side from the code block dividing unit 10b that inputs code blocks to the error correction encoding unit 50c are omitted. The configurations on the transmission antenna side from the rate matching unit 10d are also omitted. The configuration and the function of the rate matching unit 10d are the same as in the first embodiment.

The error correction encoding unit 50c includes two LDPC encoding units 53 and 54 and the redundant bit generation circuit 15. Of these, the redundant bit generation circuit 15 generates check bits between the code blocks. The configuration and the function of the redundant bit generation circuit 15 is the same as in the first embodiment.

Each of the LDPC encoding units 53 and 54 receives the code block obtained by dividing the information bit sequence from, for example, the code block dividing unit 10b shown in FIG. 2 and encodes the code block to LDPC in parallel. More specifically, each of the LDPC encoding units 53 and 54 multiplies the received code block by the generator matrix G. The LDPC encoding units 53 and 54 can be formed by, for example, electronic circuits including product sum circuits. However, a CPU, a DSP, or the like may execute a computer program expanded to be executable on the memory to execute the encoding process.

The rate matching unit 10d transfers the LDPC of the code blocks generated by the LDPC encoding units 53 and 54 and the redundant bits as the check bits between the code blocks generated by the redundant bit generation circuit 15 to circuits on the latter stage, such as, the modulation unit 10e and the frequency up-converter 10f shown in FIG. 2.

Figure 18:
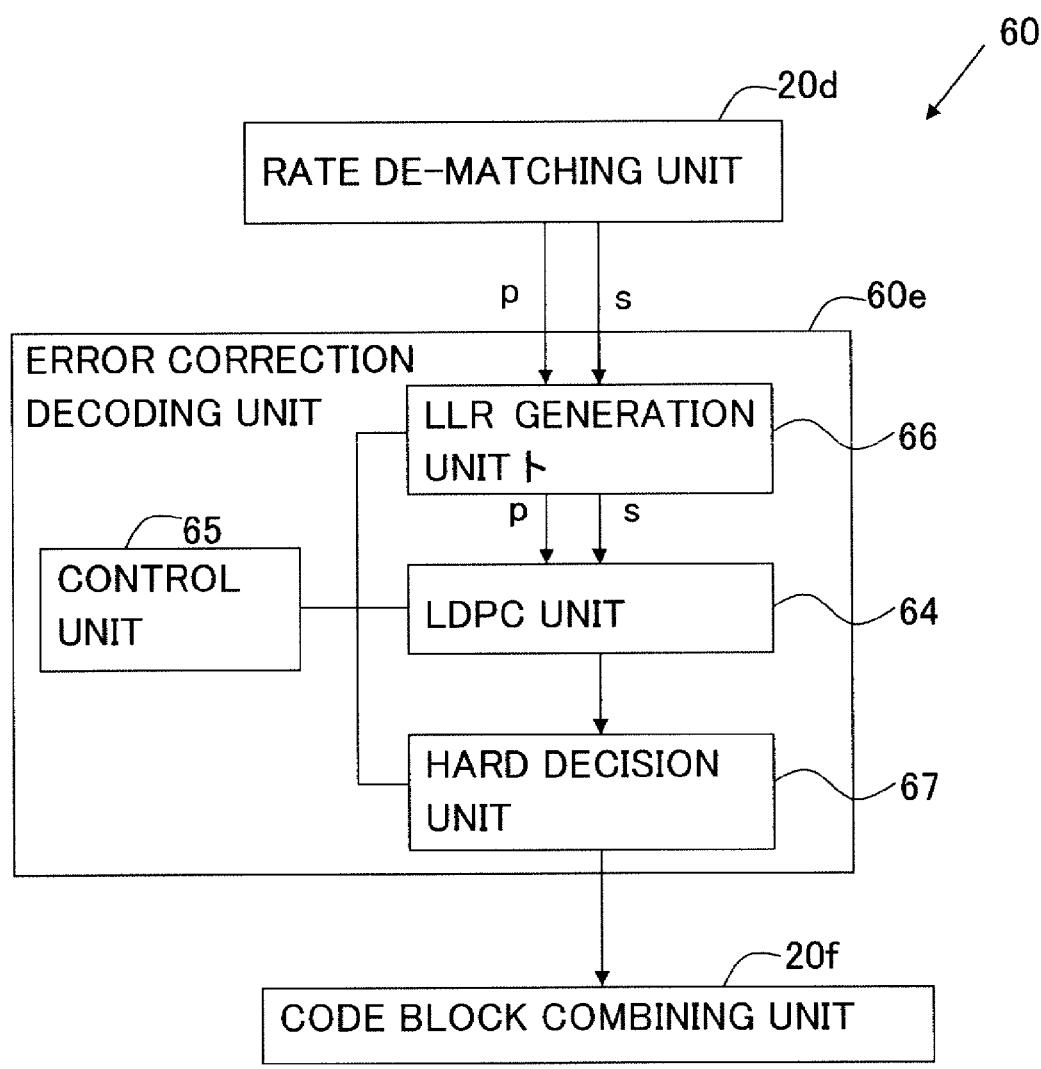
FIG. 18 is a diagram illustrating a configuration of a receiver according to the second embodiment.

FIG. 18 illustrates a configuration of the receiver 60 according to the second embodiment. The configuration of the receiver 60 of the second embodiment is the same as the receiver 20 of the first embodiment shown in FIG. 10 except that an error correction decoding unit 60e is used in place of the error correction decoding unit 20e. However, in FIG. 18, the rate de-matching unit 20d, the error correction decoding unit 60e that receives a received bit sequence from the rate de-matching unit 20d, and the code block combining unit 20f are illustrated.

As shown in FIG. 18, the error correction decoding unit 60e includes an LLR generation unit 66, an LDPC unit 64, a hard decision unit 67, and a control unit 65. The LLR generation unit 66 converts the received bit to the LLR. It can be stated that the value obtained by converting the received bit to the LLR is an initial value of the LLR corresponding to each bit. The process of the LLR generation unit 66 is the same as the log-likelihood ratio calculator 21a or the log-likelihood ratio calculator 21c of the first embodiment. The LLR generation unit 66 inputs the generated LLR to the LDPC unit 64 (arrow s). The LLR generation unit 66 converts the redundant bits that are parities between the code blocks to the LLR and inputs the LLR to the LDPC unit 64 (arrow p).

The hard decision unit 67 performs hard decision based on the posterior log-likelihood ratio after decoding process by the LDPC unit 64 and establishes bit 0 or 1. For example, bit 0 is set if the posterior log-likelihood ratio is positive, and bit 1 is set if the posterior log-likelihood ratio is negative. The hard decision unit 67 further multiplies a bit sequence Z of the obtained code block by a check matrix H to perform parity check. In the parity check, whether $HZ^t=0$ is determined. The hard decision unit 67 is an example of the output unit.

The control unit 65 controls a data flow of the LLR generation unit 66, the LDPC unit 64, and the hard decision unit 67 and controls the number of repetitions of the decoding process by the LDPC unit 64.

Figure 19:
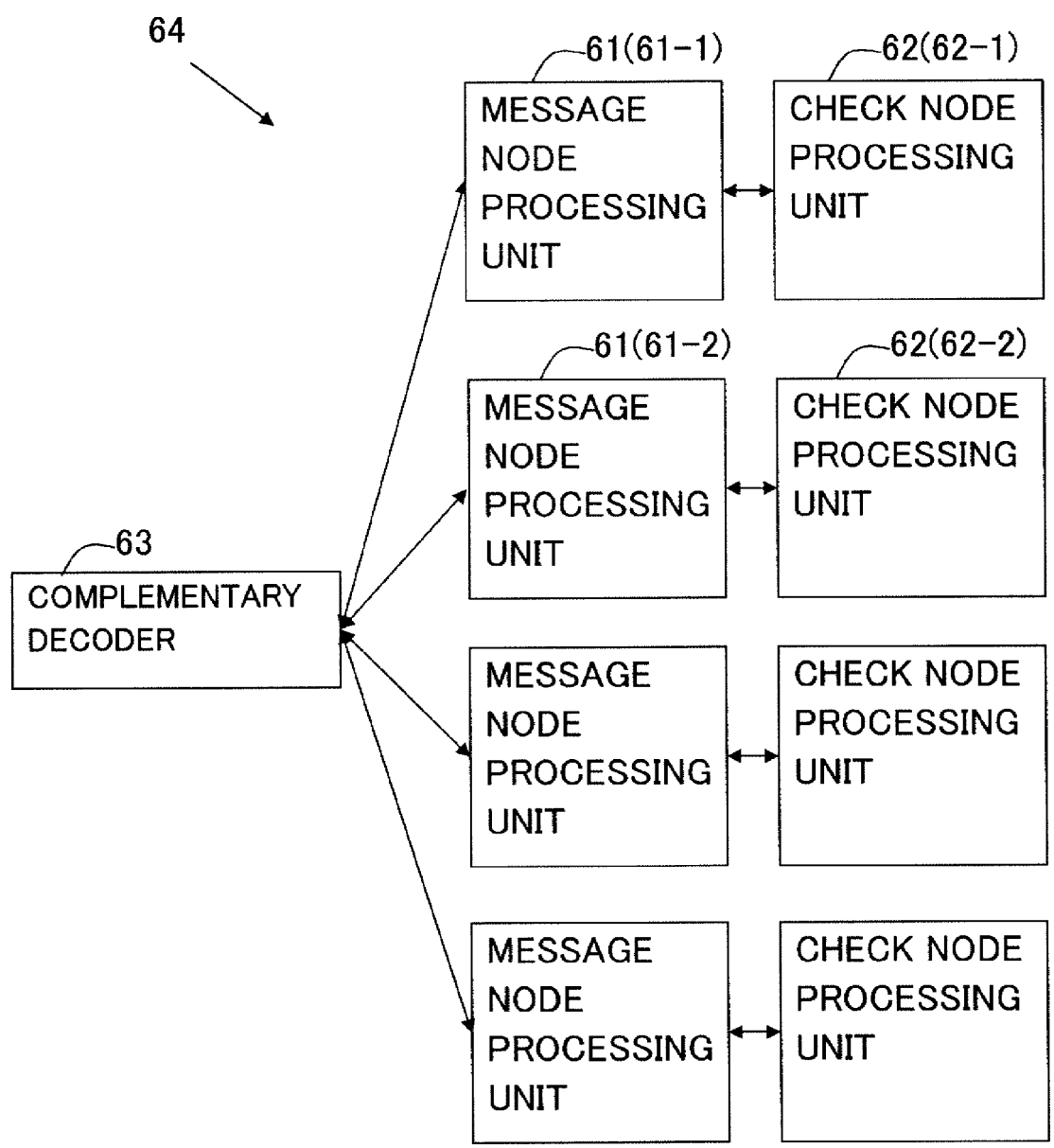
FIG. 19 is a diagram illustrating a detailed configuration of an LDPC unit.

FIG. 19 illustrates a detailed configuration of the LDPC unit 64. As shown in FIG. 19, the LDPC unit 64 of the second embodiment includes a plurality of message node processing units 61-1, 61-2, and the like, a plurality of check node processing units 62-1, 62-2, and the like, and a complementary decoder 63. Hereinafter, when the plurality of message node processing units 61-1, 61-2, and the like are collectively called, the plurality of message node processing units 61-1, 61-2, and the like will be simply called a message node processing unit 61. When the plurality of check node processing units 62-1, 62-2, and the like are collectively called, the plurality of check node processing units 62-1, 62-2, and the like will be simply called a check node processing unit 62. The message node processing unit 61 is an example of the information bit calculation unit. The check node processing unit 62 is an example of the check calculation unit.

Among these, the check node processing unit 62 executes row processing in LDPC decoding. In the row processing in the LDPC decoding, the check node processing unit 62 calculates, for each row m of (m, n) satisfying an element Hmn=1 of the check matrix H, the log-likelihood ratio LLR of an n-th bit of the information bits for an aggregate of bit sequences participating in a check row m. However, the log-likelihood ratio LLR of the n-th bit calculated for each row m is called a partial log-likelihood ratio. The check node processing unit 62 further subtracts the partial log-likelihood ratio calculated last time from the calculated partial log-likelihood ratio to calculate an incremental value of the partial log-likelihood ratio, that is, extrinsic information of each row of the check matrix.

Meanwhile, the message node processing unit 61 executes column processing in the LDPC decoding. In the column processing, the message node processing unit 61 adds the incremental value of the partial log-likelihood ratio of the n-th bit of the information bits to each column of (m, n) satisfying the element Hmn=1 of the check matrix H to calculate the posterior log-likelihood ratio LLR. The posterior log-likelihood ratio LLR becomes a priori log-likelihood ratio LLR in the next process in the repetitive process.

The message node processing unit 61 and the check node processing unit 62 shown in FIG. 19 may be configured to correspond to a Tanner graph based on the check matrix. More specifically, message nodes according to the number of bits of the code word of the LDPC may be provided. The check node processing units 62 according to the number of rows of the check matrix may be provided corresponding to the row processing of the check matrix, that is, a parity check formula. The message node processing units 61 or the check node processing units 62 may be formed by hardware circuits. The hardware circuits of the message node processing units 61 or the check node processing units 62 may be consolidated based on the relationship between the processing performance and the required processing speed. For example, hardware circuits that process a plurality of bits may be provided as the plurality of message node processing units 61. Hardware circuits that execute processing of a plurality of rows of the check matrix may be provided as the plurality of check node processing units 62.

Processors, such as CPUs and DSPs, may serve as the message node processing units 61 or the check node processing units 62 to execute computer programs expanded on the memory. When the processors, such as CPUs and DSPs, function as the message node processing units 61 or the check node processing units 62, the number of processors can be determined from the required processing speed. For example, a single CPU or DSP may execute the processes of all message node processing units 61 or the check node processing units 62. The CPU or the DSP may be provided to each of the individual message node processing units 61 or the check node processing units 62.

Figure 20:
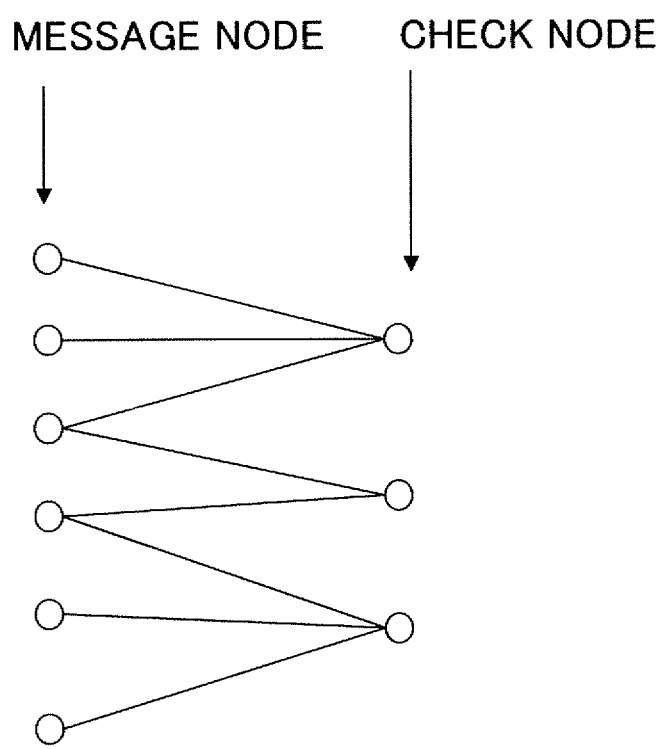
FIG. 20 is an example of a Tanner graph.

FIG. 20 shows an example of a Tanner graph corresponding to the check matrix. In the Tanner graph, the message nodes correspond to the bits of the code word, and the check nodes correspond to the rows of the check matrix. The lines connecting the message nodes and the check nodes show a relationship between an n-th bit of the code word checked in an m-th row of the check matrix and the m-th row of the check matrix in the check matrix (Hmn) (m=1, . . . M, n=1, . . . N) based on element Hmn=1.

As shown in FIG. 20, a case in which three message nodes are connected to a specific check node will be considered. The case in which three message nodes are connected to the specific check node is equivalent to a case in which a specific row includes three elements with value 1 in the check matrix (Hmn). In this case, in the case of the code word in which the parity check formula=0, the following cases can be considered if values of three message nodes MN0, MN1, and MN2 are expressed by (value of MN0, value of MN1, value of MN2): (000), (011), (101), and (110).

Therefore, the probability that one of the three message nodes is 0 increases when an even number of 1 is included as values of the other two message nodes. More specifically, of the log-likelihood ratios in which one message node of the three message nodes is 0, the partial log-likelihood ratio corresponding to one row of the check matrix can be calculated as follows. More specifically, the probability of setting the values of the other two message nodes excluding the message node for calculating the partial log-likelihood ratio to (0, 0) or (1, 1) is reflected on the partial log-likelihood ratio.

Thus, if the message node for generating the partial log-likelihood ratios is MN2, and the values of the other two message nodes MN0 and MN1 are x(0) and x(1), a partial log-likelihood ratio y(i) for transmitting the message node to MN2 can be expressed by the following Expression 6. In Expression 6, the LLRs of the nodes x(0) and x(1) of message are x(0) and x(1).

$$y(i) = \ln \frac{\exp(0) + \exp(x(0) + x(1))}{\exp(x(0)) + \exp(x(1))} \quad \text{[Expression 6]}$$

The numerator of Expression 6 is equivalent to the probability that an even number of the two message nodes have bit 1, and the denominator is equivalent to the probability that an odd number of the two message nodes have bit 1.

In the Tanner graph shown in FIG. 20, two message nodes of the three message nodes connected to the check nodes are selected, y(i) as the LLR is calculated based on the LLR values according to Expression 6, and an increment of the calculated partial log-likelihood ratio is transmitted to the message node xi. The increment of the partial log-likelihood ratio is a value obtained by subtracting the partial log-likelihood ratio calculated last time from y(i) calculated in Expression 6.

The partial log-likelihood ratio of Expression 6 is further calculated for a combination of the message nodes MN0 and MN2, and the increment of the calculated partial log-likelihood ratio is transmitted to the message node MN1. The partial log-likelihood ratio of Expression 6 is also calculated for a combination of the message nodes MN1 and MN2, and the increment of the calculated partial log-likelihood ratio is transmitted to the message node MN0. The foregoing process is one process by the check node.

If there are four message nodes connected to the check nodes, the four check nodes are divided into three check nodes for calculating the partial log-likelihood ratio y(i) and the message node MNi that receives the increment of the partial log-likelihood ratio, and the partial log-likelihood ratio y(i) is calculated based on the following Expression 7.

$$y(i) = \ln \frac{\exp(0) + \exp(x(0) + x(1)) + \exp(x(0) + x(2)) + \exp(x(1) + x(2))}{\exp(x(0)) + \exp(x(1)) + \exp(x(2)) + \exp(x(0) + x(1) + x(2))} \quad \text{[Expression 7]}$$

The numerator of Expression 7 is equivalent to the probability that an even number of the three message nodes have bit 1, and the denominator is equivalent to the probability that an odd number of the three message nodes have bit 1.

If Expression 6 or Expression 7 is generalized, the following Expression 8 can be shown.

y(i)=ln(probability that there are an even number of message nodes with bit 1 among the message nodes connected to the check nodes/probability that there are an odd number of message nodes with bit 1 among the message nodes connected to the check nodes); [Expression 8]

Meanwhile, in each message node, z as an LLR after update is calculated based on the following Expression 9, where the increment value of the LLR (partial log-likelihood ratio) transmitted from the check node is x(i).

$$z = y + \Sigma x(i) \quad \text{[Expression 9]}$$

Here, Σ denotes an addition related to the check nodes connected to the message nodes. It can also be stated that E denotes an addition of the partial log-likelihood ratios related to the code word n (n=1, . . . , N) in a column n where Hmn=1 in the check matrix (Hmn). Furthermore, y denotes a value of z of the last time.

Figure 21:
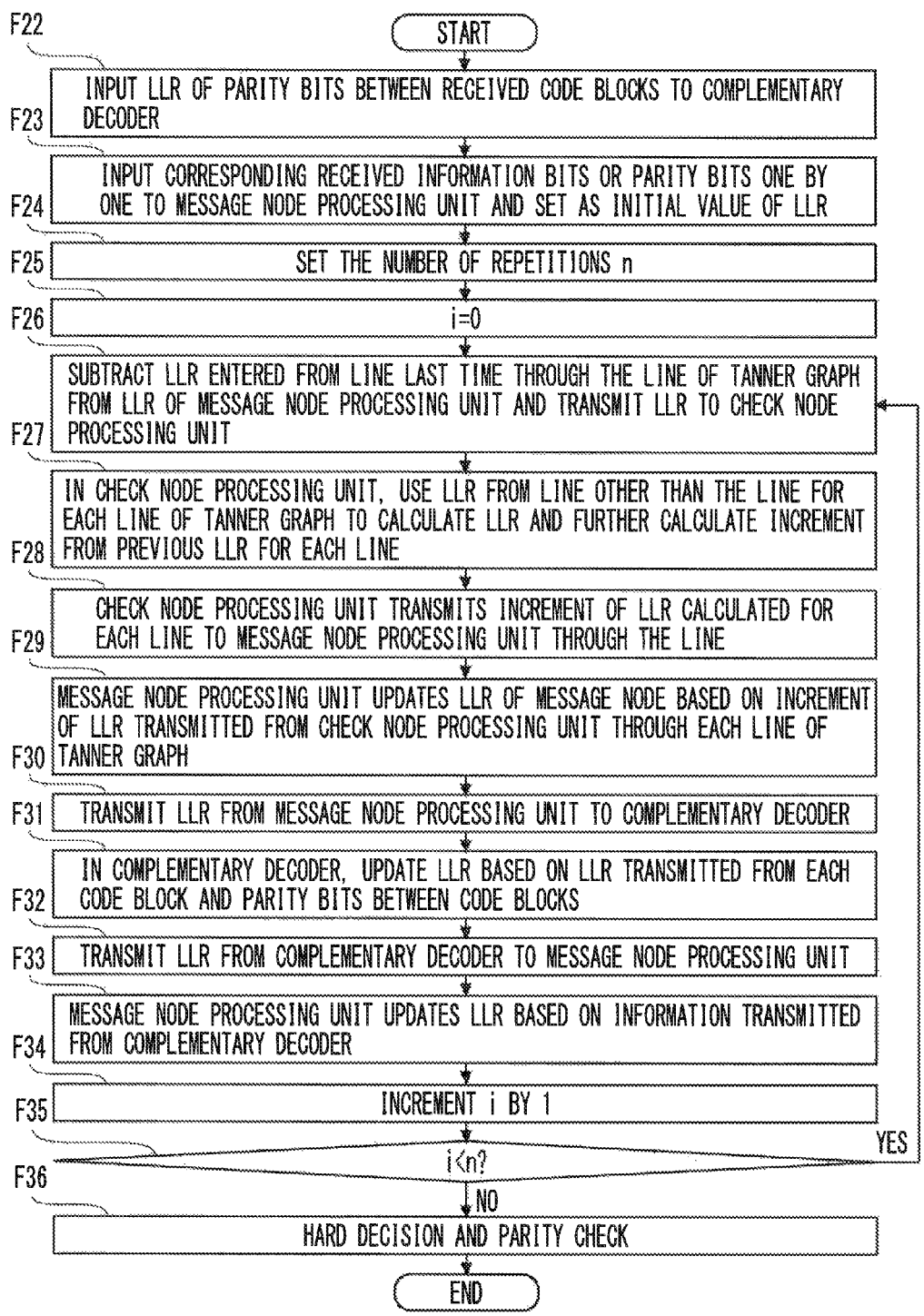
FIG. 21 is a diagram showing a processing procedure of an error correction decoding unit according to the second embodiment.

FIG. 21 shows a processing procedure of the error correction decoding unit 60e according to the second embodiment. The process of FIG. 21 is executed by cooperative processing by the message node processing unit 61 and the check node processing unit 62 shown in FIG. 19. However, for example, a CPU or a DSP (Data Signal Processor) may execute a computer program to execute the process of FIG. 21.

In the process, the parity between the received code blocks, that is, the LLR of the redundant bits, is first input to the complementary decoder 63 (F22). For example, the LLR generation unit 66 shown in FIG. 18 converts the redundant bits separated from the received data to the LLR and inputs the LLR to the complementary decoder 63.

Next, the received information bits or the parity bits are input to the message node processing units 61 bit by bit (F23). For example, the LLR generation unit 66 shown in FIG. 18 converts the received information bits and the parity bits separated from the received data to the LLR and inputs the LLR to the message node processing units 61 that process the received information bits and the parity bits.

Next, the control unit 65 sets the number of repetitions n (F24). The number of repetitions denotes the number of repetitions of the series of processes by the complementary decoder 63, the message node processing unit 61, and the check node processing unit 62. The control unit 65 initializes the counter value i of the number of repetitions to 0 (F25). The following decoding process is repeatedly executed.

First, the message node processing unit 61 calculates the LLR to be transmitted to the check node processing unit 62 connected by the Tanner graph. The message node processing unit 61 transmits, as a so-called prior value, the LLR in the message node to the check node that manages the check formula of each row of the check matrix (F26).

However, the LLR transmitted last time from the check node processing unit 62 connected by the Tanner graph is subtracted from the LLR in the message node. Hereinafter, the LLR transmitted last time from the check node processing unit 62 connected by the Tanner graph will be called a previous value of the partial log-likelihood ratio.

The reason that the previous value of the partial log-likelihood ratio is subtracted from the LLR in the message node is as follows. The partial log-likelihood ratio is a value calculated by the check node processing unit 62 connected by the Tanner graph according to the check formula corresponding to the row of the check matrix based on the LLR of a message node other than the message node. To calculate the next partial log-likelihood ratio in the check node, the information equivalent to the previous value of the partial log-likelihood ratio is further updated in another message node connected to the check node and then transmitted from the other message node to the check node. Therefore, the previous value of the partial log-likelihood ratio is subtracted from the LLR in the message node. The message node processing unit 61 transmits the LLR, from which the previous value of the partial log-likelihood ratio is subtracted, to the check node processing unit 62 connected by the Tanner graph. However, when the process of F26 is executed by the repetition of the first time, the initial value of the LLR calculated from the received information bit can be transmitted to the check node.

The check node processing unit 62 connected by the Tanner graph and the message node processing unit 61 are defined by the column where Hnm=1 in each row of the check matrix (Hnm). More specifically, the message node processing unit 61 that processes the received bits corresponding to the column where Hnm=1 and the check node processing unit 62 corresponding to the row form the Tanner graph. Therefore, it can be stated that the process of F26 is a process of transmitting, in each row of the check matrix (Hnm), the prior value of the LLR from the message node processing unit 61 corresponding to the column where Hnm=1 to the check node processing unit 62 corresponding to each row.

Next, in each line of the Tanner graph, the check node processing unit 62 uses the LLR transmitted from a line other than the line to calculate the LLR. The LLR is illustrated in Expressions 6 to 8. Expression 6 shows an example in which there are three message nodes connected to the check node and shows a case of a check formula corresponding to a row including three elements where Hmn=1 in the check matrix (Hmn). Expression 7 shows an example in which there are four message nodes connected to the check node and shows a case of a check formula corresponding to a row including four elements where Hmn=1 in the check matrix (Hmn). The calculation can be similarly performed when the number of elements where Hmn=1 included in the row of the check matrix is not three or four. Hereinafter, the LLR calculated for each line will be called a partial log-likelihood ratio. The reason that the LLR calculated for each line is called the partial log-likelihood ratio is that the partial log-likelihood ratio is equivalent to the information obtained from the check formula corresponding to one row of the check matrix. The message node side will calculate the next LLR based on the partial log-likelihood ratios from a plurality of check nodes corresponding to a plurality of rows.

The check node processing unit 62 subtracts the previous LLR from the LLR (partial log-likelihood ratio) calculated for each line to calculate an increment of the LLR (partial log-likelihood ratio) of each line (F27).

The check node processing unit 62 transmits the increment of the LLR (partial log-likelihood ratio) calculated for each line to the message node processing unit 61 (F28).

The message node processing unit 61 updates the LLR of the message node based on the increment of the LLR (partial log-likelihood ratio) transmitted from the check node processing unit 62 connected by the Tanner graph (F29). The LLR of the message node is calculated by, for example, Expression 9. It can be stated that the process of F29 is an addition process of the increment of the LLR (partial log-likelihood ratio) to the column direction of the check matrix. It can be stated that the LLR of the message node is current reliability information of the bit managed by the message node.

Next, the message node processing unit 61 transmits the LLR of the message node to the complementary decoder 63 (F30).

Next, the complementary decoder 63 updates the LLR based on the LLR transmitted from the message node corresponding to the bits of each code block and the redundant bits (F31). The process of F31 is the same as the process of the complementary decoder 21p of the first embodiment. It can be stated that the process of F31 is a process using the parity between the code blocks to further improve the reliability of the LLR of the message node.

The complementary decoder 63 transmits the updated LLR to the message node at the LLR transmission source in the process of F31 (F32).

The message node processing unit 61 sets the LLR transmitted from the complementary decoder 63 as an updated LLR (F33). More specifically, the process of F33 is a process of replacing the LLR of the message node processing unit 61 by the LLR transmitted from the complementary decoder 63.

After the process of F33, the counter i is incremented by 1 (F34). The counter i can be, for example, a circuit that is triggered by data transmission from the complementary decoder 63 for the increment. However, if the process of FIG. 20 is executed by a CPU or a DSP that executes a computer program, F34 is an increment of a variable in the program.

A comparator not shown compares the counter i and the number of repetitions n (F35). If the counter i is smaller than the number of repetitions n, the control is moved to the process of F26. In the process of F26, each message node subtracts the LLR transmitted last time from the check node processing unit 62 connected by the Tanner graph from the current LLR in the message node. Each message node transmits the LLR (prior value) to the check node connected by the Tanner graph.

On the other hand, if the counter i is equal to or greater than the number of repetitions n in the decision of F35, the control unit 35 executes hard decision processing and parity check (F36). More specifically, bits of code word (estimation word) are generated from the LLR in the hard decision processing. The code word and the check matrix are multiplied, and the parity check is performed. If the multiplication result of the code word and the check matrix=0, that is, if the parity check result is normal, the code word is output. If the multiplication result of the code word and the check matrix is !=0, that is, the parity check result is not normal, an error is reported.

A dedicated calculation circuit, such as a comparator, or a calculation circuit or the like that performs sum-of-products calculation may execute the hard decision processing and parity check.

As described, according to the encoding apparatus 50 and the decoding apparatus 60 of the present embodiment, each data block is encoded by the low density parity check code to generate code blocks, and the generation of the LLR (prior value) in the message node processing unit 61 and the generation of the LLR (partial log-likelihood ratio) in the check node processing unit 62 are repeatedly executed for each code block. Furthermore, in each repetition, the LLRs of the bits of each data block are generated based on the parity generated between the data blocks. Therefore, compared to when decoding of the low density parity check code is executed to the code blocks obtained by applying error correction encoding to the data in the individual data blocks as in the past, the code word can be estimated from the information across the plurality of data blocks. Therefore, for example, even if causes of failures such as noise are concentrated on one data block, the possibility of error correction can be increased based on the information of other data blocks.

In the process of FIG. 21, an example in which the message node processing unit 61, the check node processing unit 62, and the complementary decoder 63 repeat the process for fixed n times is illustrated. In place of the process of FIG. 21, hard decision may be performed once at the end of the process of each time, such as when the LLR is returned from the complementary decoder 63 to the message node processing unit 61, to calculate the bit sequence s of the code block. Then, the parity check based on the check matrix H, that is, the check process of whether $Hs^t=0$, may be executed. The decoding process may be finished when the check formula $Hs^t=0$ based on the check matrix H is satisfied even before the completion of the number of processes n.

In FIGS. 19 to 21, the decoding process of the LDPC is described according to the Tanner graph. However, the Tanner graph is a concept for describing the decoding process of the LDPC, and the decoding apparatus 60 is not limited by the Tanner graph. More specifically, the LDPC unit 64 shown in FIG. 18 can calculate the LLR (partial log-likelihood ratio) according to the check matrix and according to the calculation in the row direction, that is, the formulas of Expressions 6 to 8. The LDPC unit 64 can calculate the LLR of each bit according to the check matrix and according to the calculation in the column direction, that is, Expression 9. Therefore, the hardware configuration of the LDPC unit 64 may not strictly correspond to the Tanner graph. However, for example, the division of a module of a computer program executed by the CPU or the DSP may be performed according to the message nodes of the Tanner graph and the check nodes. More specifically, modules may be formed for each message node and each check node, and the modules may communicate with each other and perform repetitive decoding.

Third Embodiment

Figure 22:
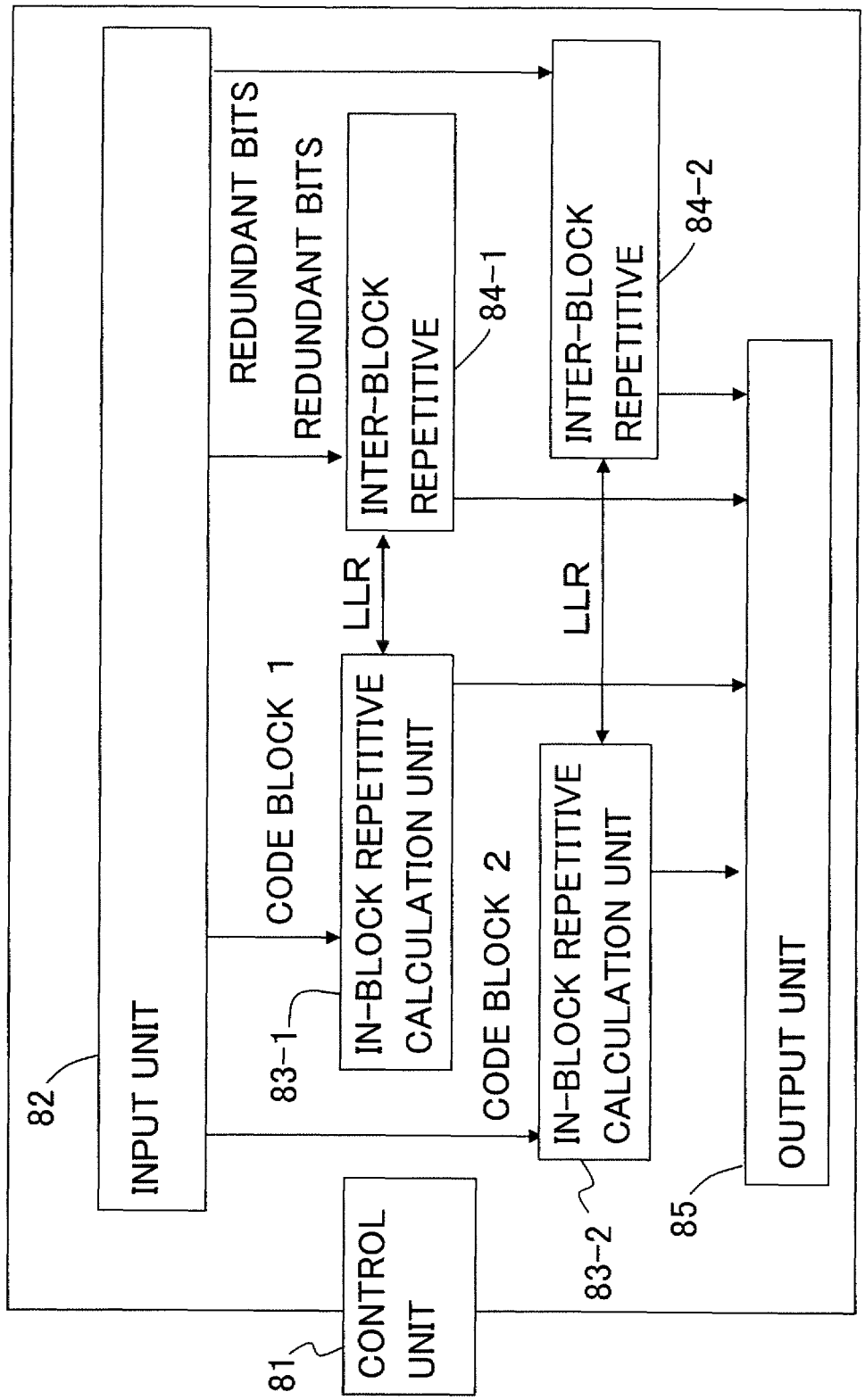
FIG. 22 is a diagram illustrating a configuration of a decoding apparatus according to a third embodiment.

FIG. 22 illustrates a configuration of a decoding apparatus according to a third embodiment. The decoding apparatus of FIG. 22 is embedded in, for example, a receiver, such as a cell phone, a data communication terminal, and a receiver of television broadcasting, that receives data encoded by a transmitter and transmitted from the transmitter. Furthermore, for example, a storage medium storing encoded data of sound, voice, video, text, graphics, and the like or data of the storage apparatus can be embedded in a reproduction apparatus.

The constituent elements of FIG. 22 can be illustrated as hardware circuits that execute digital signal processing. However, a processor, such as a CPU and a DSP, may execute computer programs expanded to be executable on the memory as the constituent elements shown in FIG. 22. The decoding apparatus of FIG. 22 may include both the CPU, DSP, and the like and the hardware circuits.

As shown in FIG. 22, the decoding apparatus of the third embodiment includes a control unit 81, an input unit 82, in-block repetitive calculation units 83-1 and 83-2, inter-block repetitive calculation units 84-1 and 84-2, and an output unit 85. Hereinafter, the in-block repetitive calculation units 83-1 and 83-2 will be collectively called an in-block repetitive calculation unit 83. The inter-block repetitive calculation units 84-1 and 84-2 will be collectively called an inter-block repetitive calculation unit 84.

The control unit 81 controls the process of the entire decoding apparatus. For example, the control unit 81 performs activation of the decoding apparatus, repetitive control of the in-block repetitive calculation unit 83 and the inter-block repetitive calculation unit 84, and the like. The repetitive control is a process of repeatedly operating the in-block repetitive calculation unit 83 and the inter-block repetitive calculation unit 84 for fixed n times. However, for example, the process repeated by the in-block repetitive calculation unit 83 and the inter-block repetitive calculation unit 84 may be terminated to output the hard decision result from the output unit 85 when the data decoded by the in-block repetitive calculation unit 83 and the inter-block repetitive calculation unit 84 satisfies a predetermined standard, such as when the hard decision result of the decoded data satisfies a predetermined check condition.

The input unit 82 separates the input bit sequence into code blocks and redundant bits. The input unit 82 is, for example, the rate de-matching unit 20d of the first embodiment. However, for example, the configuration from the antenna 20a to the rate de-matching unit 20d can be considered to be equivalent to the input unit 82. Furthermore, for example, a data reading unit not shown can be considered to be equivalent to the input unit 82 in a reproduction apparatus that reproduces sound, voice, video, text, and graphics from a recording medium that records sound, voice, video, text, and graphics or from a storage apparatus that stores sound, voice, video, text, and graphics. As described, the redundant bits are a result of a logical operation of bits between data blocks to be encoded to code blocks. The relationship between the set of the code blocks corresponding to the data blocks contributed to the logical operation for generating the redundant bits and the redundant bits can be determined in advance between the transmitter and the receiver, between the recording apparatus that records the data to the recording medium and the reproduction apparatus, or between the storage apparatus and the reproduction apparatus. Hereinafter, a case of generating the redundant bits from two data blocks will be assumed and described in the third embodiment. However, the number of data blocks contributed to the generation of the redundant bits is not limited to two, and the redundant bits may be generated from three or more data blocks.

For example, to decode data that has generated redundant bits from two data blocks, it is preferable to provide two in-block repetitive calculation units 83-1 and 83-2 as shown in FIG. 22. To generate redundant bits from three or more data blocks, it is preferable to provide in-block repetitive calculation units 83 corresponding to the data blocks involved in the generation of the redundant bits. This is because a plurality of code blocks can be processed in parallel. However, when the decoding speed required by the process of the in-block repetitive calculation unit 83 can be sufficiently attained, one in-block repetitive calculation unit 83 may be provided. More specifically, one in-block repetitive calculation unit 83 can sequentially decode a plurality of code blocks. In that case, a buffer memory that holds the code block in the middle of the repetitive process can be provided.

The in-block repetitive calculation unit 83 repeats a process of handling the bit sequence in the code blocks as an input to calculate reliability information of signal bits in the data blocks that are error-correction-encoded to the code blocks and further handling the calculated reliability information as an input to calculate new reliability information of the signal bits in the data blocks that are error-correction encoded to the code blocks. However, every time new reliability information is calculated, the in-block repetitive calculation unit 83 transfers the calculated reliability information to the inter-block repetitive calculation unit 84. The in-block repetitive calculation unit 83 can be illustrated as, for example, a configuration in which the complementary decoder 21p is removed from the first turbo decoding circuit 21 of FIG. 12. The in-block repetitive calculation unit 83 can be illustrated as, for example, a configuration in which the complementary decoder 21p is removed from the second turbo decoding circuit 22 of FIG. 12. The in-block repetitive calculation unit 83 can be illustrated as, for example, a configuration in which the complementary decoder 63 is removed from the LDPC unit of FIG. 19.

The inter-block repetitive calculation unit 84 receives the LLRs of the redundant bits generated between the data blocks included in each set from the input unit 82. Every time the in-block repetitive calculation unit 83 calculates new reliability information, the inter-block repetitive calculation unit 64 receives the calculated reliability information from the in-block repetitive calculation units 83-1 and 83-2. Based on the reliability information received from the in-block repetitive calculation units 83-1 and 83-2, the inter-block repetitive calculation unit 64 further creates the LLRs between the bits contributed to the redundant bit generation in each set of the data blocks and returns the created LLRs to the in-block repetitive calculation units 83-1 and 83-2.

The inter-block repetitive calculation unit 84 is similar to the complementary decoder 21p of FIG. 12 and the complementary decoder 63 of FIG. 19. More specifically, based on the reliability information of the signal bits in the data blocks repeatedly calculated by the in-block repetitive calculation unit 83, the inter-block repetitive calculation unit 84 calculates inter-block reliability information indicating the reliability of the signal bits contributed to the generation of the redundant bits in the data blocks included in each set. The inter-block repetitive calculation unit 84 then inputs the inter-block reliability information as the reliability information of the signal bits to the in-block repetitive calculation unit 83. The inter-block repetitive calculation unit 84 repeats the LLR creation process between code blocks in conjunction with the process by the in-block repetitive calculation unit 83.

In FIG. 22, a plurality of inter-block repetitive calculation units 84 are provided. However, the number of inter-block repetitive calculation unit 84 may be one. More specifically, for example, the inter-block repetitive calculation unit 84 performs control of waiting until the LLRs for the bits of the code blocks involved in the redundant bits are all present, for the set of the code blocks corresponding to the plurality of data blocks involved in the generation of the redundant bits. When the LLRs of the bits involved in the redundant bits are all present in each code block, the inter-block repetitive calculation unit 84 may calculate the LLRs of the bits. When the LLRs of the bits involved in the redundant bits are updated in relation to any one code block included in the set of a plurality of code blocks, already generated LLRs may be used for the other code blocks to create the LLRs between codes based on the redundant bits. In any case, a buffer memory that holds the code block in the middle of the repetitive process can be provided.

As described, according to the decoding apparatus of the third embodiment, when the data blocks are decoded from the code blocks obtained by applying error correction encoding to the data blocks obtained by dividing the signal bit sequence, the LLRs are created between the bits contributed to the generation of the redundant bits between the code blocks based on the redundant bits between the code blocks. The LLRs between the bits contributed to the generation of the redundant bits are illustrated by, for example, Formula (1) of Expression 1 of the first embodiment. Therefore, when the signal bit sequence is divided into the data blocks and error-correction-encoded to the code blocks, information from the other code blocks can be imported even if soft decision decoding is performed by the repetitive process of each code block. More specifically, the target code block can be effectively decoded from a wide range of information bit sequence to obtain a data block without being limited by the range of the code block, that is, without being limited by the range of the data block obtained by dividing the signal bit sequence.

Others

In the present embodiment and the first and second modified embodiments described above, the encoding apparatus and the decoding apparatus include hardware elements. Examples of the hardware elements include an FPGA [Field Programmable Gate Array], an ASIC [Application Specific Integrated Circuit], an LSI [Large Scale Integration], an IC [Integrated Circuit], a gate array, and a logic gate. Examples of the logic gate include AND, OR, NOT, NAND, NOR, a flip-flop, and a counter.

The encoding apparatus and the decoding apparatus may include hardware elements and software elements. Examples of the software elements include an interface program, a driver program, a module program, a component program, firmware, an object, a class, a task, a process, a function, an attribute, a procedure, a subroutine, a program code, a microcode, a code segment, an extra segment, a stack segment, a table, data, a program area, a data area, data, a database, a data configuration, a field, a record, a matrix, an array, a variable, and a parameter.

All software elements illustrated above may be described in a C language, C++, Java (trademark of Sun Microsystems of the United States), Visual Basic (trademark of Microsoft Corporation of the United States), Perl, Ruby, and many other programming languages.

The encoding apparatus and the decoding apparatus described in the first and second embodiments can be applied to a transmitter and a receiver as well as to, for example, a recording apparatus that stores voice, sound, music, video, and various data. The encoding apparatus and the decoding apparatus described in the first and second embodiments can also be applied to a reproduction apparatus that reproduces voice, sound, music, video, and various data from the data recorded in the recording apparatus.

Therefore, according to an aspect of the present invention, the reliability of a digital signal improves, for which a dividing process of dividing a bit sequence into blocks is executed.

All example and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present invention(s) has(have) been described in detail, it should be understood that the various changes, substitutions, and alterations could be made hereto without departing from the spirit and scope of the invention.

What is claimed is:

1. A decoding apparatus comprising:
an input unit configured to input redundant bits generated between data blocks included in each set combining a plurality of data blocks obtained by dividing a signal bit sequence and code blocks obtained by applying error correction encoding to the data blocks;
an in-block repetitive calculation unit configured to repeat a process, by using the code blocks as an input, to calculate reliability information of signal bits in the data blocks that are error-correction-encoded to the code blocks and further, by using the calculated reliability information as an input, to calculate new reliability information of the signal bits in the data blocks that are error-correction-encoded to the code blocks; and
an inter-block repetitive calculation unit configured to repeat a process to calculate inter-block reliability information indicating the reliability of signal bits contributing to the generation of the redundant bits between the data blocks included in each set, based on the redundant bits generated between the data blocks included in each set and the reliability information of the signal bits in the data blocks, the reliability information repeatedly calculated by the in-block repetitive calculation unit, and to input the inter-block reliability information as reliability information of the signal bits to the in-block repetitive calculation unit.

2. The decoding apparatus according to claim 1, further comprising:
a control unit configured to repeat calculation of the reliability information by the in-block repetitive calculation unit and the inter-block repetitive calculation unit up to a predetermined limit; and
an output unit configured to repeat estimation values of the signal bits of the data blocks based on the reliability information calculated by the in-block repetitive calculation unit or the inter-block repetitive calculation unit after the calculation of the reliability information up to the predetermined limit is repeated.

3. The decoding apparatus according to claim 1, wherein
the code blocks include signal bits, a first check bit sequence generated from the signal bits and a second check bit sequence generated from rearranged signal bits obtained by applying a predetermined rearrangement operation to the signal bits,
the in-block repetitive calculation unit comprises a first decoder and a second decoder,
the first decoder is configured to calculate a first incremental value of the reliability information of each of signal bits of the data blocks and is configured to supply the first incremental value to the second decoder based on a first prior estimation value and the first check bit sequence, the first prior estimation value including (a) the reliability information calculated from each of the signal bits, (b) an incremental value of the reliability information based on a previous calculation result of the reliability information and (c) a second incremental value of the reliability information of each of the signal bits of the data blocks calculated by the second decoder, and
the second decoder is configured to calculate the second incremental value of the reliability information of each of signal bits of the data blocks and is configured to supply the second incremental value to the first decoder based on the second prior estimation value and the second check bit sequence, the second prior estimation value including (a) the reliability information calculated from each of the signal bits, (b) the incremental value of the reliability information based on the previous calculation result of the reliability information and (c) the first incremental value,
wherein (a) the reliability information calculated from each of the signal bits, (b) the first incremental value and (c) the second incremental value are added to be supplied to the inter-block repetitive calculation unit as reliability information of each of signal bits of the data blocks.

4. The decoding apparatus according to claim 1, wherein the code blocks are turbo-encoded code blocks,
the in-block repetitive calculation unit comprises a plurality of turbo decoding units that are configured to apply turbo decoding to the turbo-encoded code blocks by a plurality of element decoders repeating generation of the reliability information of the signal bits based on soft decision decoding while mutually supplying the incremental values of the reliability information of the signal bits, and
at least one of the plurality of element decoders included in the turbo decoding units is configured to generate the incremental value of the reliability information for the signal bits of the data blocks error-correction-encoded to the code blocks processed by the turbo decoding unit based on the reliability information of the signal bits by other turbo decoding units and the redundant bits.

5. The decoding apparatus according to claim 1, wherein the plurality of code blocks include cyclic redundancy check (CRC) codes, the decoding apparatus further comprising
a CRC calculation unit that is configured to perform CRC on the estimation values of the bits of the data blocks based on the reliability information until the calculation of the reliability information is repeated up to the predetermined limit and that is configured to change the reliability information to the maximum and to supply the reliability information to the in-block repetitive calculation unit when it is determined that there is no code error.

6. The decoding apparatus according to claim 1, wherein the code blocks are encoded by a low density parity check code satisfying a check formula based on a predetermined check matrix,
the in-block repetitive calculation unit comprises a check calculation unit and an information bit calculation unit corresponding to the signal bits of the code blocks,
the check calculation unit is configured so as to correspond to the rows of the check matrix, and in accordance with a condition in which a combination of the signal bits of the code blocks corresponding to a column in which the element of the row is 1 satisfies the check formula of the row, is configured to calculate reliability information of each signal bit in the combination from other signal bits in the combination, the information bit calculation unit is configured so as to correspond to the signal bits in the code blocks and is configured to add partial reliability information for the signal bits calculated by the plurality of check calculation units to calculate the reliability information corresponding to the bits of the code blocks, and the inter-block repetitive calculation unit is configured to calculate new reliability information of the bits from the reliability information of the bits of the data blocks calculated by the information bit calculation unit and the redundant bits between the data blocks and is configured to supply the new reliability information to the check calculation unit through the information bit calculation unit.

7. A receiver comprising:

a reception unit configured to combine a plurality of data blocks obtained by dividing a signal bit sequence and configured to receive redundant bits generated between the data blocks included in each set and code blocks obtained by applying error correction encoding to the data blocks;

an in-block repetitive calculation unit configured to repeat a process of handling a bit sequence in the code blocks as an input to calculate reliability information of signal bits in the data blocks that are error-correction-encoded to the code blocks and further handling the calculated reliability information as an input to calculate new reliability information of the signal bits in the data blocks that are error-correction-encoded to the code blocks; and an inter-block repetitive calculation unit configured to repeat a process of calculating inter-block reliability information indicating the reliability of signal bits contributed to the generation of redundant bits in the data blocks included in each set based on the redundant bits generated between the data blocks included in each set and the reliability information of the signal bits in the data blocks repeatedly calculated by the in-block repetitive calculation unit and configured to supply the inter-block reliability information as reliability information of the signal bit to the in-block repetitive calculation unit.

* * * * *